United States Patent
Okamoto et al.

(10) Patent No.: US 9,419,622 B2
(45) Date of Patent: Aug. 16, 2016

(54) SEMICONDUCTOR DEVICE

(71) Applicant: Semiconductor Energy Laboratory Co., Ltd., Atsugi-shi, Kanagawa-ken (JP)

(72) Inventors: Yuki Okamoto, Kanagawa (JP); Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/635,115

(22) Filed: Mar. 2, 2015

(65) Prior Publication Data

US 2015/0256181 A1 Sep. 10, 2015

(30) Foreign Application Priority Data

Mar. 7, 2014 (JP) .................................. 2014-044469
Mar. 11, 2014 (JP) .................................. 2014-047203

(51) Int. Cl.
*H03K 19/00* (2006.01)
*H03K 19/177* (2006.01)

(52) U.S. Cl.
CPC .................................. *H03K 19/1776* (2013.01)

(58) Field of Classification Search
CPC ................ H03K 19/017581; H03K 19/17756; H03K 19/177
USPC .......................................... 326/38, 40, 41, 47
See application file for complete search history.

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Yuki Okamoto et al, "Novel Application of Crystalline Indium—Gallium—Zinc—Oxide Technology to LSI: Dynamically Reconfigurable Programmable Logic Device Based on Multi-Context Architecture", ECS Transactions 54 (1) 141-149 (2013), The Electrochemical Society.

(Continued)

*Primary Examiner* — Daniel D Chang
(74) *Attorney, Agent, or Firm* — Fish & Richardson P.C.

(57) ABSTRACT

To provide a semiconductor device in which signal-transmission speed between a first logic element and a second logic element is not lowered. The semiconductor device includes a first switch between the first logic element and the second logic element, and configuration to the first switch is repeatedly performed until configuration is performed on the first switch while a low-level voltage is input to the first switch from the first logic element.

19 Claims, 21 Drawing Sheets

(56) References Cited

U.S. PATENT DOCUMENTS

| | | | |
|---|---|---|---|
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,547,753 B2 | 10/2013 | Takemura et al. | |
| 8,760,931 B2 | 6/2014 | Takemura et al. | |
| 8,947,121 B2 * | 2/2015 | Kurokawa | H03K 19/17748 326/38 |
| 8,970,253 B2 * | 3/2015 | Kurokawa | H03K 19/0013 326/38 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0089417 A1 | 4/2011 | Yamazaki et al. | |
| 2012/0293201 A1 | 11/2012 | Fujita et al. | |
| 2013/0286757 A1 | 10/2013 | Takemura | |
| 2013/0293263 A1 * | 11/2013 | Kurokawa | H03K 19/094 326/41 |
| 2014/0103960 A1 * | 4/2014 | Yamazaki | H03K 19/0013 326/41 |
| 2014/0159771 A1 * | 6/2014 | Ikeda | H03K 19/0016 326/41 |
| 2015/0256182 A1 | 9/2015 | Okamoto et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Asakuma.N. et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase" Phys. Rev. A (Physical Review. A), May 1, 1984, vol. 29, No. 5, pp. 2957-2959.

(56) References Cited

OTHER PUBLICATIONS

Dembo.H et al., "RFCPUs on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m-32 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUs on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide—Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

(56) References Cited

OTHER PUBLICATIONS

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

SEMICONDUCTOR DEVICE

BACKGROUND OF THE INVENTION

1. Field of the Invention

The present invention relates to an object, a method, or a manufacturing method. In addition, the present invention relates to a process, a machine, manufacture, or a composition of matter. One embodiment of the present invention relates to a semiconductor device, a display device, a light-emitting device, a power storage device, a driving method thereof, or a manufacturing method thereof. In particular, one embodiment of the present invention relates to a semiconductor device, a display device, or a light-emitting device each including an oxide semiconductor.

Another embodiment of the present invention relates to a programmable logic device (PLD) in which the configuration of hardware can be changed, a semiconductor device including the programmable logic device, or a driving method thereof.

2. Description of the Related Art

The internal circuit structure of the programmable logic device can be changed by a user after manufacture.

Examples of user-programmable devices are small-scale integrated circuits such as programmable array logic (PAL) and generic array logic (GAL) and large-scale integrated circuits such as a complex programmable logic device (CPLD) and a field programmable gate array (FPGA). In this specification, PAL, GAL, a CPLD, and an FPGA are collectively referred to as a PLD.

The PLD includes a logic element (LE). The LE is the minimum unit of a logic resource included in a combinational circuit, a sequential circuit, or the like.

A function of the PLD can be changed by changing a function of the LE. Moreover, a function of the PLD can be changed by changing a conduction state (conduction and non-conduction) of a wiring between the LEs.

Non-Patent Document 1 discloses a multi-context PLD. A switch (MC-RS in Non-Patent Document 1) that changes the conduction state of the wiring is provided between LEs.

The multi-context PLD performs operation based on a selected configuration data set. Furthermore, a non-selected configuration data set can be rewritten while the multi-context PLD operates. A PLD in which data can be rewritten while the PLD operates is also referred to as a dynamically reconfigurable PLD.

Non-Patent Document 1 discloses that the boosting effect of a path transistor included in a PLD can boost the voltage of a node SN; therefore, the switching speed is improved as compared with the conventional SRAM.

REFERENCE

Non-Patent Document

[Non-Patent Document 1] Y. Okamoto et al., "Novel Application of Crystalline Indium-Gallium-Zinc-Oxide Technology to LSI: Dynamically Reconfigurable Programmable Logic Device Based on Multi-Context Architecture," ECS Trans., vol. 54, no. 1, pp. 141-149, June 2013.

SUMMARY OF THE INVENTION

Even in the case of using the boosting effect of the path transistor in Non-Patent Document 1, signal-transmission speed is not improved in some cases.

FIG. 1 illustrates a circuit diagram of a wiring switch 1 provided between an LE 11 and an LE 12. The wiring switch 1 has a multi context function. The wiring switch 1 has a function of a memory that stores configuration data (hereinafter also referred to as a configuration memory).

The wiring switch 1 includes a switch 101 and a switch 102.

The switch 101 includes a transistor 14, a transistor 15, a transistor 18, and a capacitor 16. The switch 102 includes a transistor 24, a transistor 25, a transistor 28, and a capacitor 26.

A gate of the transistor 14 is electrically connected to a wiring 4[0] (hereinafter a wiring 4 is also referred to as a selection signal line or a word line). One of a source and a drain of the transistor 14 is electrically connected to a wiring 2 (hereinafter also referred to as a data line or a bit line). The other of the source and the drain of the transistor 14 is electrically connected to a gate of the transistor 15 and one electrode of the capacitor 16.

One of a source and a drain of the transistor 15 is electrically connected to a wiring 1001 (hereinafter also referred to as a signal line) and an output terminal of the LE 11. The other of the source and the drain of the transistor 15 is electrically connected to one of a source and a drain of the transistor 18.

A gate of the transistor 18 is electrically connected to a wiring 3[0] (hereinafter a wiring 3 is also referred to as a selection signal line). The other of the source and the drain of the transistor 18 is electrically connected to a wiring 1002 (hereinafter also referred to as a signal line) and an input terminal of the LE 12.

The other electrode of the capacitor 16 is electrically connected to a power line and the like. In FIG. 1, the electrode is electrically connected to a wiring to which a reference potential (GND) is applied (e.g., a power line). To the wiring, a voltage that is different from GND may be applied as long as a constant voltage is applied.

The capacitor 16 is provided as needed.

A gate of the transistor 24 is electrically connected to a wiring 4[1]. One of a source and a drain of the transistor 24 is electrically connected to a wiring 2. The other of the source and the drain of the transistor 24 is electrically connected to a gate of the transistor 25 and one electrode of the capacitor 26.

One of a source and a drain of the transistor 25 is electrically connected to a wiring 1001 and an output terminal of the LE 11. The other of the source and the drain of the transistor 25 is electrically connected to one of a source and a drain of the transistor 28.

A gate of the transistor 28 is electrically connected to a wiring 3[1]. The other of the source and the drain of the transistor 28 is electrically connected to a wiring 1002 and an input terminal of the LE 12.

The other electrode of the capacitor 26 is electrically connected to a power line and the like. In FIG. 1, the electrode is electrically connected to a wiring to which a reference potential (GND) is applied (e.g., a power line). To the wiring, a voltage that is different from GND may be applied as long as a constant voltage is applied.

The capacitor 26 is provided as needed.

A signal of the wiring 4[0] controls an on state (hereinafter also referred to as a conduction state) and an off state (hereinafter also referred to as a non-conduction state) of the transistor 14. In the case where configuration data is written to the switch 101, a selection signal is input to the switch 101 from the wiring 4[0].

The wiring 2 is a data line (bit line) to which a signal (data signal) corresponding to configuration data is input.

While the transistor 14 is on, configuration data is written to the capacitor 16 by the signal of the wiring 2.

When an oxide semiconductor layer is used for a channel formation region of the transistor 14, leakage current between the source and the drain is extremely small while the transistor 14 is off. Thus, the configuration data can be stored in a node 17 for a long time.

The configuration data stored in the node 17 controls an on state and an off state of the transistor 15.

A signal of the wiring 3[0] controls an on state and an off state of the transistor 18. In the case where configuration data is read from the switch 101, a selection signal is input to the switch 101 from the wiring 3[0].

A signal of the wiring 4[1] controls an on state and an off state of the transistor 24. In the case where configuration data is written to the switch 102, a selection signal is input to the switch 102 from the wiring 4[1].

While the transistor 24 is on, configuration data is written to the capacitor 26 by the signal of the wiring 2.

When an oxide semiconductor layer is used for a channel formation region of the transistor 24, leakage current between the source and the drain is extremely small while the transistor 24 is off. Thus, the configuration data can be stored in a node 27 for a long time.

The configuration data stored in the node 27 controls an on state and an off state of the transistor 25.

A signal of the wiring 3[1] controls an on state and an off state of the transistor 28. In the case where configuration data is read from the switch 102, a selection signal is input to the switch 102 from the wiring 3[1].

FIG. 2 is a timing chart when first configuration data is selected and then second configuration data is selected in the circuit in FIG. 1.

To select the first configuration data, the voltage of the wiring 3[0] is set at a high level, and the voltage of the wiring 3[1] is set at a low level. To select the second configuration data, the voltage of the wiring 3[0] is set at a low level, and the voltage of the wiring 3[1] is set at a high level.

Here, a voltage corresponding to a high level is VDD. The voltage corresponding to a high level is higher than a low level and constant, and may be a voltage other than VDD.

Here, a voltage corresponding to a low level is GND. The voltage corresponding to a low level is lower than a high level and constant, and may be a voltage other than GND.

<Time T0 to Time T1>

A low-level voltage is applied to the wiring 1001. A high-level voltage is applied to the wiring 2. A high-level voltage is applied to the wiring 4[0]. The transistor 14 is turned on, and configuration data corresponding to a high level is written to the capacitor 16. The configuration data corresponding to a high level is also written to the node 17.

A low-level voltage is applied to the wiring 4[0]. A low-level voltage is applied to the wiring 2. The transistor 14 is turned off. The leakage current of the transistor 14 in an off state is extremely small; thus, the configuration data is stored in the node 17.

A low-level voltage is applied to the wiring 3[0]. The transistor 18 is off. That is, the switch 101 is not selected. In this manner, while the switch 101 is not selected, the configuration data is written to and stored in the node 17.

Note that a low-level voltage is applied to the wiring 3[1]. The transistor 28 is off. That is, the switch 102 is not selected.

<Time T1>

A high-level voltage is applied to the wiring 3[0]. Then, the transistor 18 is turned on, and the switch 101 is selected.

A low-level voltage is applied to the wiring 3[1]. The transistor 28 is off. That is, the switch 102 is not selected.

When the voltage of the wiring 1001 is changed from a low level to a high level, owing to capacitive coupling via gate capacitance of the transistor 15, the voltage of the node 17 is boosted higher than VDD, for example, is boosted close to 2VDD. Thus, the voltage of the wiring 1002 becomes a high level rapidly. Then, the signal-transmission speed between the wiring 1001 and the wiring 1002 through the wiring switch 1 is improved.

<Time T2>

When the voltage of the wiring 1001 is changed from a high level to a low level, owing to capacitive coupling via gate capacitance of the transistor 15, the voltage of the node 17 is lowered to VDD. However, the voltage between the source and the gate of the transistor 15 is VDD, and the transistor 15 is still on; thus, the voltage of the wiring 1002 becomes a low level rapidly.

<Time T3 to Time T4>

A low-level voltage is applied to the wiring 1001. A high-level voltage is applied to the wiring 2. A high-level voltage is applied to the wiring 4[1]. The transistor 24 is turned on, and configuration data corresponding to a high level is written to the capacitor 26. The configuration data corresponding to a high level is also written to the node 27.

A low-level voltage is applied to the wiring 4[1]. A low-level voltage is applied to the wiring 2. The transistor 24 is turned off. The leakage current of the transistor 24 in an off state is extremely small; thus, the configuration data is stored in the node 27.

A low-level voltage is applied to the wiring 3[1]. The transistor 28 is off. That is, the switch 102 is not selected. In this manner, while the switch 102 is not selected, the configuration data is written to and stored in the node 27.

Note that a high-level voltage is applied to the wiring 3[0], and the transistor 18 is on. The switch 101 is selected.

<Time T4 to Time T5>

A low-level voltage is applied to the wiring 3[0]. The transistor 18 is turned off. The switch 101 is not selected.

A high-level voltage is applied to the wiring 3[1]. Then, the transistor 28 is turned on, and the switch 102 is selected.

When the voltage of the wiring 1001 is changed from a low level to a high level, owing to capacitive coupling via gate capacitance of the transistor 25, the voltage of the node 27 is boosted higher than VDD, for example, is boosted close to 2VDD. Thus, the voltage of the wiring 1002 becomes a high level rapidly. Then, the signal-transmission speed between the wiring 1001 and the wiring 1002 through the wiring switch 1 is improved.

<Time T5>

When the voltage of the wiring 1001 is changed from a high level to a low level, owing to capacitive coupling via gate capacitance of the transistor 25, the voltage of the node 27 is lowered to VDD. However, the voltage between the source and the gate of the transistor 25 is VDD, and the transistor 25 is still on; thus, the voltage of the wiring 1002 becomes a low level rapidly.

When configuration data is written to the node 17 or the node 27 while the voltage of the wiring 1001 is at a low level, in other words, when a configuration is performed while an input signal to the wiring switch 1 is at a low level, signal-transmission speed through the wiring switch 1 is improved. Here, a configuration performed while the input signal to the wiring switch 1 is at a low level is referred to as a configuration under favorable conditions or a configuration under Condition 1. Note that also in Embodiments 1 to 4, a configuration under Condition 1 refers to a configuration performed while an input signal from a logic element to a wiring switch is at a low level.

However, in a configuration under other conditions, there is a problem in that the signal-transmission speed through the wiring switch 1 decreases. The configuration under other conditions is described with reference to FIG. 3.

<Time T0' to Time T1'>

A low-level voltage is applied to the wiring 1001. A high-level voltage is applied to the wiring 2. A high-level voltage is applied to the wiring 4[0]. The transistor 14 is turned on, and configuration data corresponding to a high level is written to the capacitor 16. The configuration data corresponding to a high level is also written to the node 17.

A low-level voltage is applied to the wiring 4[0]. A low-level voltage is applied to the wiring 2. The transistor 14 is turned off. The leakage current of the transistor 14 in an off state is extremely small; thus, the configuration data is stored in the node 17.

A low-level voltage is applied to the wiring 3[0]. The transistor 18 is off. That is, the switch 101 is not selected. In this manner, while the switch 101 is not selected, the configuration data is written to and stored in the node 17.

Note that a low-level voltage is applied to the wiring 3[1]. The transistor 28 is off. That is, the switch 102 is not selected.

<Time T1'>

A high-level voltage is applied to the wiring 3[0]. Then, the transistor 18 is turned on, and the switch 101 is selected.

When the voltage of the wiring 1001 is changed from a low level to a high level, owing to capacitive coupling via gate capacitance of the transistor 15, the voltage of the node 17 is boosted higher than VDD. Thus, the voltage of the wiring 1002 becomes a high level rapidly. Then, the signal-transmission speed between the wiring 1001 and the wiring 1002 through the wiring switch 1 is improved.

<Time T2'>

When the voltage of the wiring 1001 is changed from a high level to a low level, owing to capacitive coupling via gate capacitance of the transistor 15, the voltage of the node 17 is lowered to VDD. However, the voltage between the source and the gate of the transistor 15 is VDD, and the transistor 15 is still on; thus, the voltage of the wiring 1002 becomes a low level rapidly.

<Time T3' to Time T4'>

A high-level voltage is applied to the wiring 1001. This is the point different from the configuration under Condition 1. A high-level voltage is applied to the wiring 2. A high-level voltage is applied to the wiring 4[1]. The transistor 24 is turned on, and configuration data corresponding to a high level is written to the capacitor 26. The configuration data corresponding to a high level is also written to the node 27.

A low-level voltage is applied to the wiring 4[1]. A low-level voltage is applied to the wiring 2. The transistor 24 is turned off. The leakage current of the transistor 24 in an off state is extremely small; thus, the configuration data is stored in the node 27.

A low-level voltage is applied to the wiring 3[1]. The transistor 28 is off. That is, the switch 102 is not selected. In this manner, while the switch 102 is not selected, the configuration data is written to and stored in the node 27.

Note that a high-level voltage is applied to the wiring 3[0], and the transistor 18 is on. That is, the switch 101 is selected.

<Time T4' to Time T5'>

A low-level voltage is applied to the wiring 3[0]. The transistor 18 is turned off. That is, the switch 101 is not selected.

A high-level voltage is applied to the wiring 3[1]. Then, the transistor 28 is turned on. That is, the switch 102 is selected.

When the voltage of the wiring 1001 is changed from a high level to a low level, owing to capacitive coupling via gate capacitance of the transistor 25, the voltage of the node 27 is lowered lower than VDD. Although the drive capability of the transistor 25 becomes smaller, the voltage of the wiring 1001 is at a low level; thus, the low-level voltage is also applied to the wiring 1002. A signal is transmitted between the wiring 1001 and the wiring 1002 through the wiring switch 1.

<Time T5'>

The voltage of the wiring 1001 is changed from a low level to a high level. The voltage of the node 27 is lowered lower than VDD from T4' to T5'. Thus, the drive capability of the transistor 25 is kept small until the voltage of the node 27 is boosted. Then, the signal-transmission speed between the wiring 1001 and the wiring 1002 through the wiring switch 1 decreases.

When the voltage of the node 27 is largely lowered, the voltage of the node 27 is changed from a high level to a low level. The transistor 25 may be turned off. Then, a signal cannot be transmitted correctly between the wirings 1001 and 1002.

When configuration data is written to the node 17 or the node 27 while the voltage of the wiring 1001 is at a high level, in other words, when a configuration is performed while an input signal to the wiring switch 1 is at a high level, signal-transmission speed through the wiring switch 1 decreases. Here, a configuration performed while the input signal to the wiring switch 1 is at a high level is referred to as a configuration under unfavorable conditions or a configuration under Condition 2. Note that also in Embodiments 1 to 4, a configuration under Condition 2 refers to a configuration performed while an input signal from a logic element to a wiring switch is at a high level.

When the configuration data of the switch that is not selected is rewritten, the signal-transmission speed between the wirings 1001 and 1002 decreases depending on the voltage of the wiring 1001 in some cases.

An object of one embodiment of the present invention is to provide a semiconductor device in which signal-transmission speed between the wiring 1001 and the wiring 1002, that is, between a first logic element and a second logic element, does not decrease.

Another object of one embodiment of the present invention is to provide a semiconductor device or the like with low off-state current. Another object of one embodiment of the present invention is to provide a semiconductor device or the like with low power consumption. Another object of one embodiment of the present invention is to provide a semiconductor device or the like using a transparent semiconductor layer. Another object of one embodiment of the present invention is to provide a semiconductor device or the like using a semiconductor layer with high reliability.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a first logic element, a second logic element, and a first switch. The first switch is connected between the first logic element and the second logic element. The first switch controls conduction and non-conduction between the first logic element and the second logic element. Configuration to the first switch is repeatedly performed until configuration is performed on the first switch while a low-level voltage is input from the first logic element to the first switch.

Another embodiment of the present invention is a semiconductor device including a first logic element, a second logic element, and a first switch. The first switch is electrically connected to an output terminal of the first logic element. The first switch is electrically connected to an input terminal of the second logic element. The first switch has a function of controlling conduction and non-conduction between the first logic element and the second logic element. Configuration data can be written to the first switch. The first switch has a function of storing the written configuration data. An output of the first logic element is at a high level or a low level. Configuration data is repeatedly written to the first switch until the configuration data is written to the first switch while the output of the first logic element is at a low level.

Another embodiment of the present invention is a semiconductor device including a first logic element, a second logic element, and a first switch. The first switch is capable of controlling conduction and non-conduction between the first logic element and the second logic element. The first switch includes a second switch and a third switch. The second switch is electrically connected to an output terminal of the first logic element. The second switch is electrically connected to an input terminal of the second logic element. The third switch is electrically connected to an output terminal of the first logic element. The third switch is electrically connected to an input terminal of the second logic element. Configuration data can be written to the second switch. The second switch is capable of storing the written configuration data. Configuration data can be written to the third switch. The third switch is capable of storing the written configuration data. An output of the first logic element is at a high level or a low level. When the second switch is on, conduction between the first logic element and the second logic element is established. When the third switch is on, conduction between the first logic element and the second logic element is established. When the second switch and the third switch are off, conduction between the first logic element and the second logic element is not established. Configuration data is repeatedly written to the second switch and configuration data is repeatedly written to the third switch until the configuration data is written to the second switch and the configuration data is written to the third switch, respectively, while the output of the first logic element is at a low level.

Another embodiment of the present invention is the above semiconductor device including a determination device that determines whether the configuration data is written or not while the output of the first logic element is at a low level.

According to one embodiment of the present invention, signal-transmission speed between the first logic element and the second logic element does not decrease.

One embodiment can provide a novel object, method, manufacturing method, device, semiconductor device, display device, light-emitting device, or the like.

Note that the description of these effects does not disturb the existence of other effects. One embodiment of the present invention does not necessarily have all the effects listed above. Other effects will be apparent from and can be derived from the description of the specification, the drawings, the claims, and the like.

BRIEF DESCRIPTION OF THE DRAWINGS

In the accompanying drawings.

DETAILED DESCRIPTION OF THE INVENTION

Figure 1:
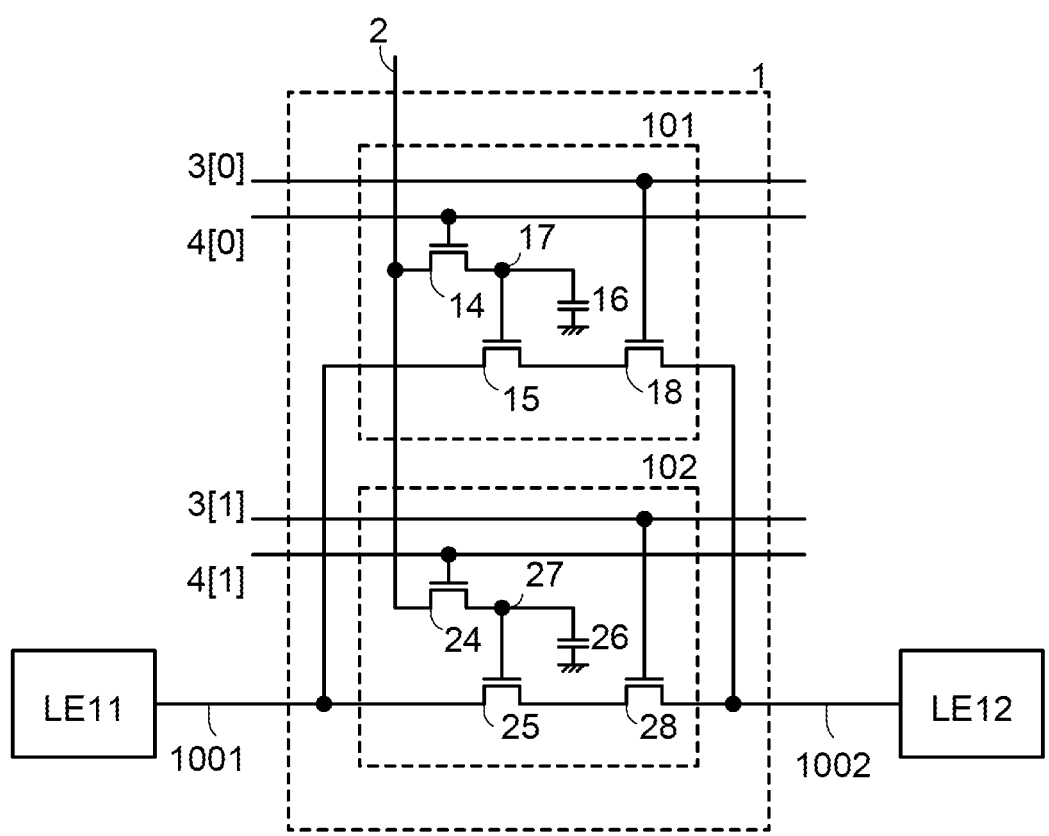
FIG. 1 shows a circuit of a switch.
Figure 2:
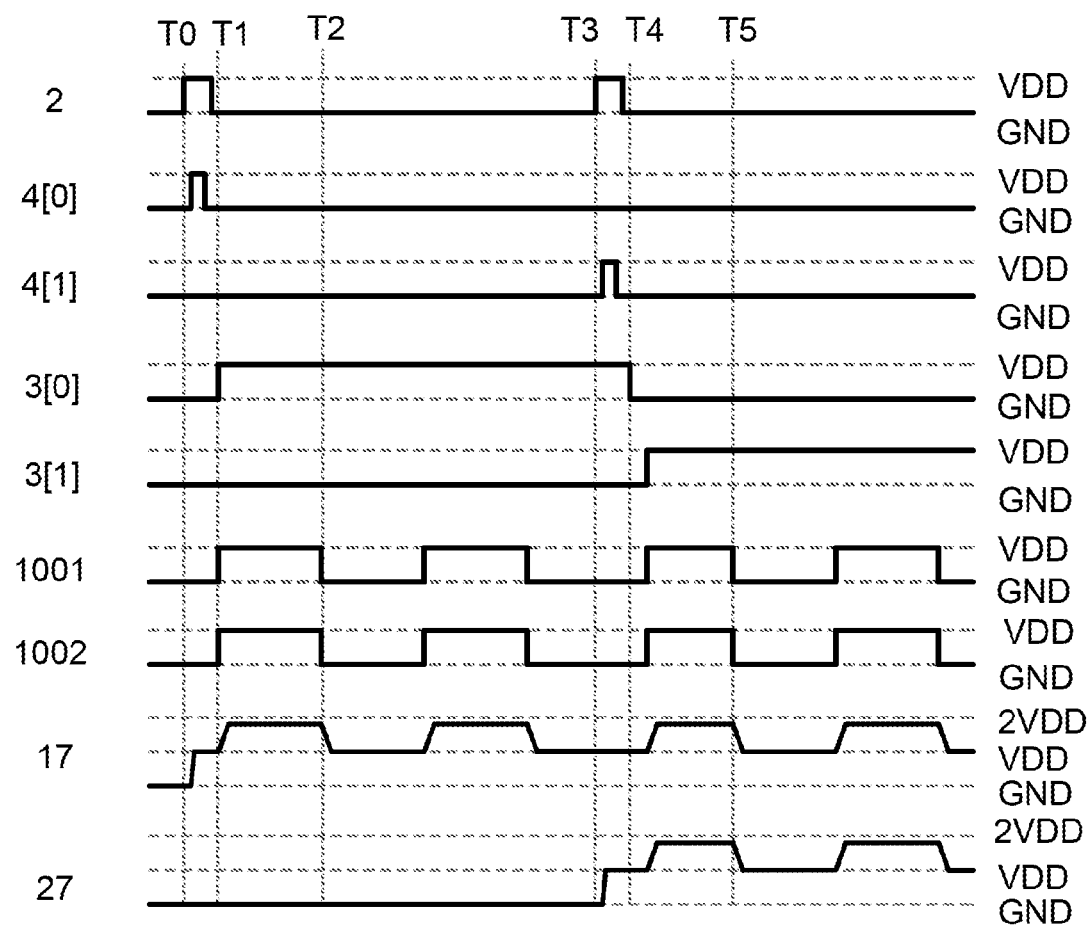
FIG. 2 shows a timing chart of a switch.
Figure 3:
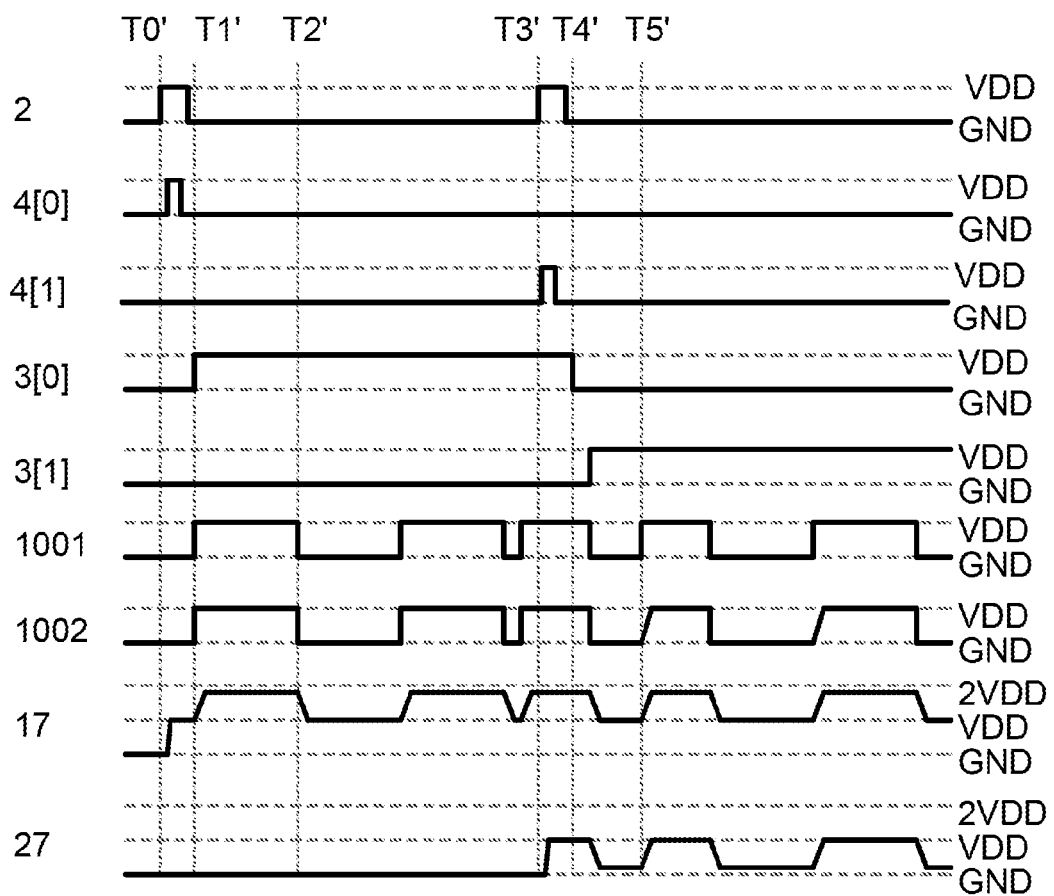
FIG. 3 shows a timing chart of a switch.

Embodiments and examples of the present invention will be described below with reference to the drawings. Note that the present invention is not limited to the following description. It will be readily appreciated by those skilled in the art that various changes and modifications are possible without departing from the spirit and the scope of the present invention. Therefore, the present invention should not be construed as being limited to the following description of the embodiments. Note that in describing the structure of the present invention with reference to the drawing, reference numerals denoting the same portions are used in different drawings in common.

In this specification, the term "connection" means electrical connection and corresponds to the circuit configuration in which current, voltage, or a potential can be supplied or transmitted. Accordingly, a connection circuit means not only direct connection but also indirect connection through an element such as a wiring, a resistor, a diode, or a transistor so that current, voltage, or potential can be supplied or transmitted.

Although the block diagram attached to this specification shows components classified by their functions in independent blocks, it is difficult to classify actual components according to their functions completely and it is possible for one component to have a plurality of functions.

Note that a "source" of a transistor means a source region that is part of a semiconductor film functioning as an active layer or a source electrode electrically connected to the semiconductor film. Similarly, a "drain" of a transistor means a drain region that is part of a semiconductor film functioning as an active layer or a drain electrode electrically connected to the semiconductor film. A "gate" means a gate electrode.

The terms "source" and "drain" of a transistor interchange with each other depending on the type of the channel of the transistor or levels of potentials applied to the terminals. In general, in an n-channel transistor, a terminal to which a lower potential is applied is called a source, and a terminal to which a higher potential is applied is called a drain. Further, in a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

Note that what is described (or part thereof) in one embodiment can be applied to, combined with, or exchanged with another content in the same embodiment and/or what is described (or part thereof) in another embodiment or other embodiments.

Note that the size, the thickness of layers, or regions in diagrams is sometimes exaggerated for simplicity. Therefore, embodiments of the present invention are not limited to such a scale.

Note that drawings are schematic views of ideal examples, and the embodiments of the present invention are not limited to the shape or the value illustrated in the drawings. For example, the following can be included: variation in shape due to a manufacturing technique or dimensional deviation; or variation in signal, voltage, or current due to noise or difference in timing.

A voltage usually refers to a potential difference between a given potential and a reference potential (e.g., a source potential or a ground potential (GND)). A voltage can be referred to as a potential and vice versa. Here, the voltage of each wiring or each terminal is relative voltage, and whether the voltage is higher or lower than reference voltage is important. Thus, GND does not necessarily mean 0 V. The same applies to the drawings, and GND in the drawings does not necessarily mean 0 V.

Even when the expression "electrically connect" is used in this specification, in an actual circuit, there is a case in which no physical connection is made and a wiring is just extended.

Note that the ordinal numbers such as "first" and "second" in this specification are used for the sake of convenience and do not denote the order of steps or the stacking order of layers. Therefore, for example, the term "first" can be replaced with the term "second", "third", or the like as appropriate. In addition, the ordinal numbers in this specification and the like are not necessarily the same as those which specify one embodiment of the present invention.

Note that a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Further, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

Embodiment 1

A concept of the present invention is described with reference to FIG. 1 and FIG. 4.

FIG. 1 illustrates a circuit diagram of a wiring switch 1 provided between an LE 11 and an LE 12. The wiring switch 1 has a multi context function. The wiring switch 1 has a function of a memory that stores configuration data (hereinafter also referred to as a configuration memory).

The wiring switch 1 includes a switch 101 and a switch 102.

The switch 101 includes a transistor 14, a transistor 15, a transistor 18, and a capacitor 16. The switch 102 includes a transistor 24, a transistor 25, a transistor 28, and a capacitor 26.

A gate of the transistor 14 is electrically connected to a wiring 4[0] (hereinafter a wiring 4 is also referred to as a selection signal line or a word line). One of a source and a drain of the transistor 14 is electrically connected to a wiring 2 (hereinafter also referred to as a data line or a bit line). The other of the source and the drain of the transistor 14 is electrically connected to a gate of the transistor 15 and one electrode of the capacitor 16.

One of a source and a drain of the transistor 15 is electrically connected to a wiring 1001 (hereinafter also referred to as a signal line) and an output terminal of the LE 11. The other of the source and the drain of the transistor 15 is electrically connected to one of a source and a drain of the transistor 18.

A gate of the transistor 18 is electrically connected to a wiring 3[0] (hereinafter a wiring 3 is also referred to as a selection signal line). The other of the source and the drain of the transistor 18 is electrically connected to a wiring 1002 (hereinafter also referred to as a signal line) and an input terminal of the LE 12.

The other electrode of the capacitor 16 is electrically connected to a power line and the like. In FIG. 1, the electrode is electrically connected to a wiring to which a reference potential (GND) is applied (e.g., a power line). To the wiring, a voltage that is different from GND may be applied as long as a constant voltage is applied.

The capacitor 16 is provided as needed.

A gate of the transistor 24 is electrically connected to a wiring 4[1]. One of a source and a drain of the transistor 24 is electrically connected to a wiring 2. The other of the source and the drain of the transistor 24 is electrically connected to a gate of the transistor 25 and one electrode of the capacitor 26.

One of a source and a drain of the transistor 25 is electrically connected to a wiring 1001 and an output terminal of the LE 11. The other of the source and the drain of the transistor 25 is electrically connected to one of a source and a drain of the transistor 28.

A gate of the transistor 28 is electrically connected to a wiring 3[1]. The other of the source and the drain of the transistor 28 is electrically connected to a wiring 1002 and an input terminal of the LE 12.

The other electrode of the capacitor 26 is electrically connected to a power line and the like. In FIG. 1, the electrode is electrically connected to a wiring to which a reference potential (GND) is applied (e.g., a power line). To the wiring, a voltage that is different from GND may be applied as long as a constant voltage is applied.

The capacitor 26 is provided as needed.

A signal of the wiring 4[0] controls an on state and an off state of the transistor 14. In the case where configuration data is written to the switch 101, a selection signal is input to the switch 101 from the wiring 4[0].

The wiring 2 is a data line (bit line) to which a signal (data signal) corresponding to configuration data is input.

While the transistor 14 is on, configuration data is written to the capacitor 16 by the signal of the wiring 2.

When an oxide semiconductor layer is used for a channel formation region of the transistor 14, leakage current between the source and the drain is extremely small while the transistor 14 is off. Thus, the configuration data can be stored in a node 17 for a long time.

The configuration data stored in the node 17 controls an on state and an off state of the transistor 15.

A signal of the wiring 3[0] controls an on state and an off state of the transistor 18. In the case where configuration data is read from the switch 101, a selection signal is input to the switch 101 from the wiring 3[0].

A signal of the wiring 4[1] controls an on state and an off state of the transistor 24. In the case where configuration data is written to the switch 102, a selection signal is input to the switch 102 from the wiring 4[1].

While the transistor 24 is on, configuration data is written to the capacitor 26 by the signal of the wiring 2.

When an oxide semiconductor layer is used for a channel formation region of the transistor 24, leakage current between the source and the drain is extremely small while the transistor 24 is off. Thus, the configuration data can be stored in a node 27 for a long time.

The configuration data stored in the node 27 controls an on state and an off state of the transistor 25.

A signal of the wiring 3[1] controls an on state and an off state of the transistor 28. In the case where configuration data is read from the switch 102, a selection signal is input to the switch 102 from the wiring 3[1].

In this embodiment, a first configuration memory refers to the switch 101, and a second configuration memory refers to the switch 102 in some cases. Furthermore, first configuration data is referred to as configuration data stored in the switch 101, and second configuration data is referred to as configuration data stored in the switch 102.

Figure 4:
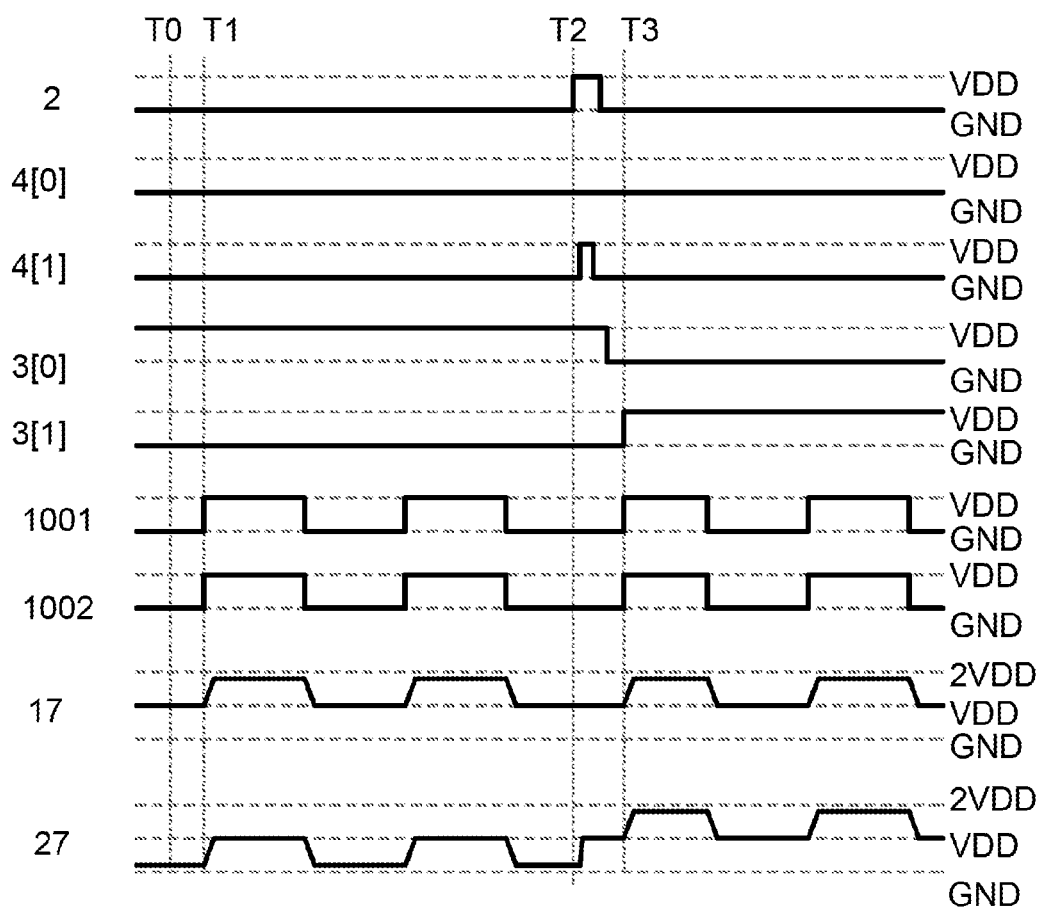
FIG. 4 shows a timing chart of a switch.

FIG. 4 is a timing chart. In the wiring switch 1 (FIG. 1), a configuration under Condition 2 is performed on a second configuration memory, and then a configuration under Condition 1 is performed on the second configuration memory.

Even when the configuration under Condition 2 is performed, the configuration is repeatedly performed until the configuration under Condition 1 is performed, whereby the signal-transmission speed between the wirings 1001 and 1002 can be improved.

<Before Time T0>

A high-level voltage is applied to the wiring 3[0]; thus, the transistor 18 is on. A low-level voltage is applied to the wiring 3[1]; thus, the transistor 28 is off. That is, the switch 101 is selected and the switch 102 is not selected. In other words, the first configuration data is selected. The voltage of the wiring 1001 is a low level and the voltage of the node 17 is a high level, and although not illustrated, when the voltage of the wiring 1001 is changed from a low level to a high level, the voltage of the node 17 is boosted higher than VDD. That is, the configuration under Condition 1 is performed. As a result, the signal-transmission speed between the wirings 1001 and 1002 through the wiring switch 1 is improved.

The switch 101 is selected and the switch 102 is not selected; thus, the second configuration data is not selected. Although not illustrated, while the switch 102 is not selected, configuration data is written to and stored in the node 27. Note that configuration data corresponding to a high level is written to and stored in the node 27 while a high-level voltage is applied to the wiring 1001; thus, the configuration under Condition 2 is performed here. After that, when the voltage of the wiring 1001 is changed from a high level to a low level, the voltage of the node 27 is lowered lower than VDD.

<Time T0>

On the second configuration memory, the configuration under Condition 2 is performed; thus, while the voltage of the wiring 1001 is at a low level, the voltage of the node 27 is lower than VDD.

Here, the switch 101 is selected. Data is written to and stored in the switch 101 in the configuration under Condition 1.

<Time T1>

When the voltage of the wiring 1001 is changed from a low level to a high level, owing to capacitive coupling via source-gate capacitance of the transistor 15, the voltage of the node 17 is boosted, so that the signal-transmission speed between the wirings 1001 and 1002 is improved. Furthermore, owing to capacitive coupling via source-gate capacitance of the transistor 25, the voltage of the node 27 is also boosted.

<Time T1 to Time T2>

The voltage of the wiring 1001 is changed from a high level to a low level. The voltage of the node 17 is lowered to VDD. Furthermore, the voltage of the node 27 is lowered lower than VDD.

Then, when the voltage of the wiring 1001 is changed from a low level to a high level, the voltage of the node 17 is boosted higher than or equal to VDD; however, the voltage of the node 27 is not boosted higher than or equal to VDD.

<Time T2 to Time T3>

A low-level voltage is applied to the wiring 1001. At Time T2, a high-level voltage is applied to the wiring 2, and then a high-level voltage is applied to the wiring 4[1]. The transistor 24 is turned on, and configuration data corresponding to a high level is written to the capacitor 26. The configuration data corresponding to a high level is also written to the node 27.

A low-level voltage is applied to the wiring 4[1]. A low-level voltage is applied to the wiring 2. The transistor 24 is turned off. The leakage current of the transistor 24 in an off state is extremely small; thus, the configuration data is stored in the node 27. That is, the configuration under Condition 1 is performed on the second configuration memory.

The voltage of the wiring 3[0] is at a low level. That is, the switch 101 is not selected.

<Time T3>

The voltage of the wiring 3[1] is at a high level. That is, the switch 102 is selected, and the second configuration data is selected.

When the voltage of the wiring 1001 is changed from a low level to a high level, owing to capacitive coupling via source-gate capacitance of the transistor 25, the voltage of the node 27 is boosted. Thus, the signal-transmission speed between the wirings 1001 and 1002 is improved.

<After Time T3>

When the voltage of the wiring 1001 is changed from a high level to a low level, the voltage of the node 27 is lowered to VDD. However, the voltage between the source and the gate of the transistor 25 is VDD, and the transistor 25 is still on; thus, the voltage of the wiring 1002 becomes a low level rapidly.

Even when the configuration under Condition 2 is performed, the configuration is repeatedly performed until the configuration under Condition 1 is performed, whereby the signal-transmission speed between the wirings 1001 and 1002 can be improved.

Embodiment 2

Another concept of the present invention is described with reference to FIG. 1 and FIG. 5. The wiring switch 1 in FIG. 1 is described in Embodiment 1.

In this embodiment, a first configuration memory refers to the switch 101, and a second configuration memory refers to the switch 102 in some cases. Furthermore, first configuration data is referred to as configuration data stored in the switch 101, and second configuration data is referred to as configuration data stored in the switch 102.

Figure 5:
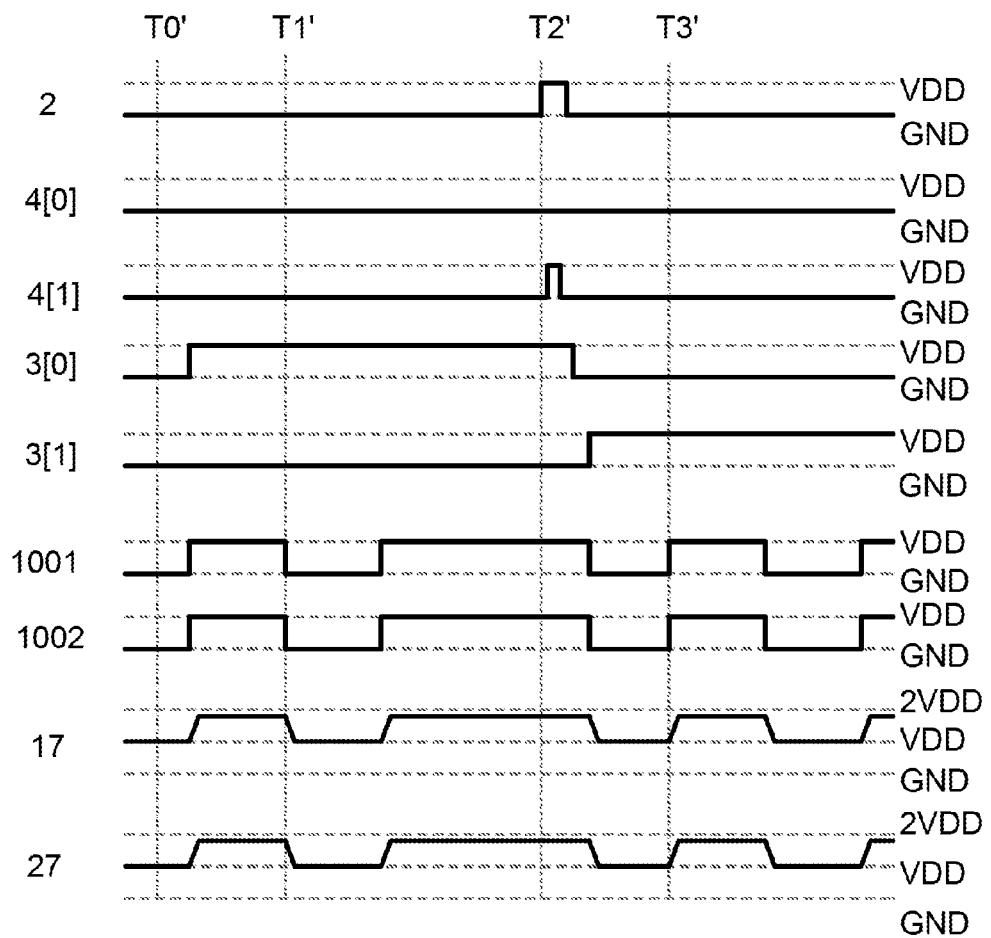
FIG. 5 shows a timing chart of a switch.

FIG. 5 is a timing chart. In the wiring switch 1, the configuration under Condition 1 is performed on the second configuration memory, and then the configuration under Condition 2 is performed on the second configuration memory.

Even when the configuration under Condition 1 is performed, and then the configuration under Condition 2 is performed, the signal-transmission speed between the wirings 1001 and 1002 does not decrease.

<Before Time T0'>

A low-level voltage is applied to the wiring 3[0], and the transistor 18 is off. That is, the switch 101 is not selected.

A low-level voltage is applied to the wiring 3[1]. The transistor 28 is off. That is, the switch 102 is not selected.

Configuration data is written to and stored in the node 27. Here, the configuration under Condition 1 is performed. That is, while a low-level voltage is applied to the wiring 1001, configuration data corresponding to a high level is written to and stored in the node 27.

A low-level voltage is applied to the wiring 1001. The voltage of the node 27 is substantially equal to VDD.

<Time T0' to Time T1'>

A high-level voltage is applied to the wiring 3[0]. Then, the transistor 18 is turned on, and the switch 101 is selected.

When the voltage of the wiring 1001 is changed from a low level to a high level, owing to capacitive coupling via source-gate capacitance of the transistor 15, the voltage of the node 17 is boosted. Thus, the signal-transmission speed between the wirings 1001 and 1002 is improved.

Note that the voltage of the node 27 is also boosted.

<Time T1' to Time T2'>

The voltage of the wiring 1001 is changed from a high level to a low level. The voltage of the node 17 is lowered to VDD. Furthermore, the voltage of the node 27 is also lowered to VDD.

Then, the voltage of the wiring 1001 is changed from a low level to a high level. Thus, the voltages of the node 17 and the node 27 are boosted.

<Time T2' to Time T3'>

A high-level voltage is applied to the wiring 1001. At this time, the voltage of the node 27 is already boosted higher than VDD, for example, to VDD+α.

A high-level voltage is applied to the wiring 2. A high-level voltage is applied to the wiring 4[1]. Here, in the transistor 24, the gate voltage is VDD (a high-level voltage of the wiring 4[1]), the voltage of one of the source and the drain is VDD (a high-level voltage of the wiring 2), and the voltage of the other of the source and the drain is VDD+α. Thus, the transistor 24 can be regarded as being in an off state.

A low-level voltage is applied to the wiring 4[1]. A low-level voltage is applied to the wiring 2. The transistor 24 is turned off. The leakage current of the transistor 24 in an off state is extremely small; thus, the configuration data (in practice, VDD+α) is stored in the node 27.

Then, when the voltage of the wiring 1001 is changed from a high level to a low level, the voltage of the node 27 is lowered to VDD.

<Time T3'>

Even when the voltage of the wiring 1001 is changed from a low level to a high level, the voltage of the node 27 is boosted higher than or equal to VDD. Thus, the improved signal-transmission speed between the wirings 1001 and 1002 can be maintained.

<After Time T3'>

When the voltage of the wiring 1001 is changed from a high level to a low level, the voltage of the node 27 is lowered to VDD. However, the voltage between the source and the gate of the transistor 25 is VDD, and the transistor 25 is still on; thus, the voltage of the wiring 1002 becomes a low level rapidly.

As described above, when the configuration under Condition 1 is performed, and then the configuration under Condition 2 is performed, the improved signal-transmission speed of the wiring switch 1 can be maintained.

Moreover, as described in Embodiment 1, when the configuration under Condition 2 is performed, and then the configuration under Condition 1 is performed, the signal-transmission speed of the wiring switch 1 can be improved.

While the wiring switch 1 is operated by a first configuration memory, if the configuration of the second configuration memory is repeatedly performed and the configuration under Condition 1 can be performed at least once, the operation speed of the wiring switch 1 by the second configuration memory is improved.

Embodiment 3

Figure 6:
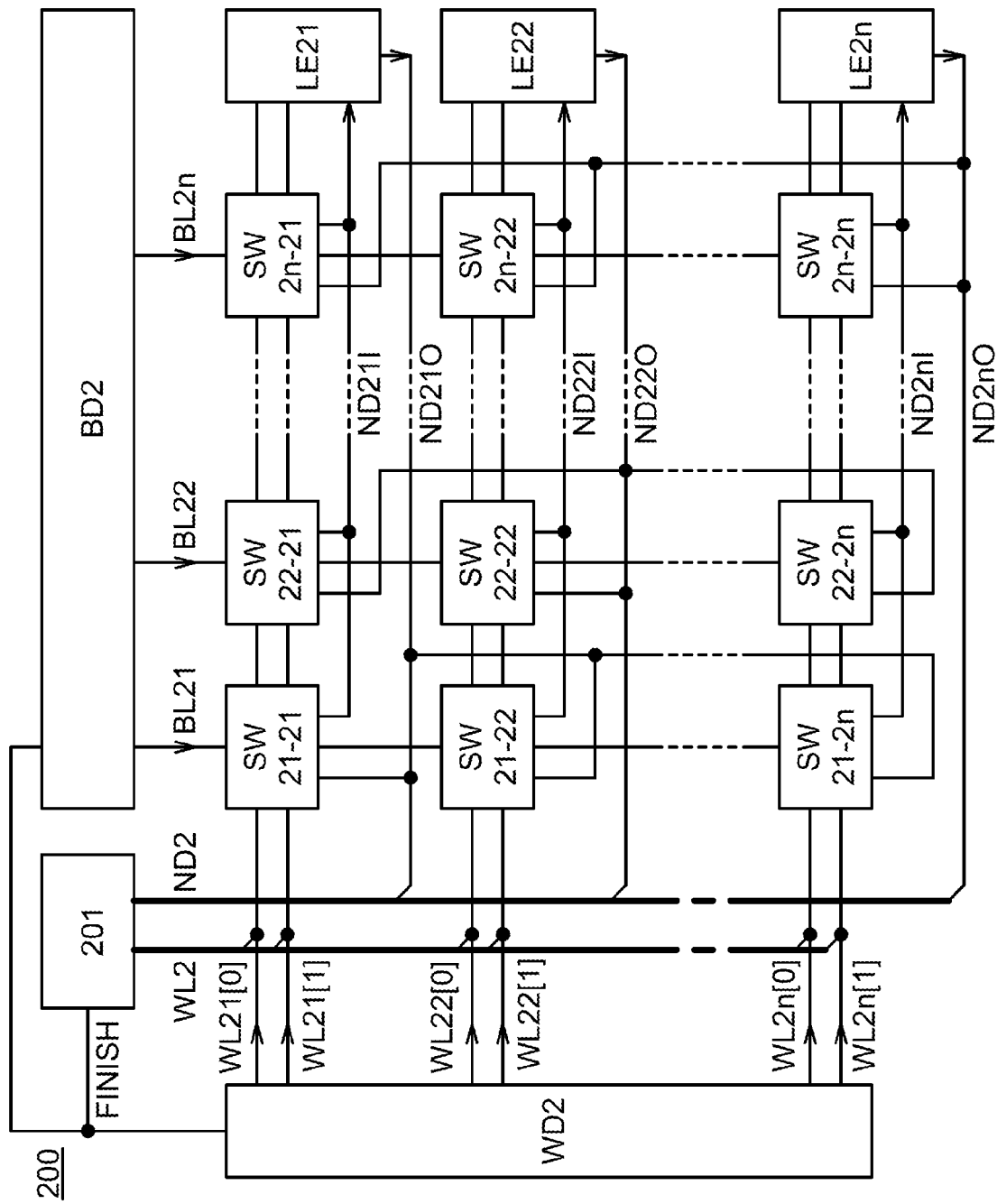
FIG. 6 shows a structure of a PLD.

FIG. 6 shows an example of a schematic block diagram of a PLD 200.

The PLD 200 includes LEs (Logic Elements), wiring switches SW, a word driver WD2, a bit driver BD2, and a determination device 201.

The LEs include an LE21 and an LE22 to an LE2n. Note that n is a natural number.

The LEs include configuration memories. Each LE has a function of outputting a certain output signal function of an input signal, depending on configuration data stored in the configuration memory. The input signals are input to the respective LEs through a signal line ND21I and a signal line ND22I to a signal line ND2nI. The output signals are output from the respective LEs through a signal line ND21O and a signal line ND22O to a signal line ND2nO.

The wiring switches SW include, in the column direction, a wiring switch SW21-21 and a wiring switch SW21-22 to a wiring switch SW21-2n, a wiring switch SW22-21 and a wiring switch SW22-22 to a wiring switch SW22-2n, and a wiring switch SW2n-21 and a wiring switch SW2n-22 to a wiring switch SW2n-2n.

The wiring switch SW has a function of controlling a conduction state between the LEs. Furthermore, each of the wiring switches includes a memory that can store configuration data.

The word driver WD2 and the bit driver BD2 have a function of controlling configurations of the LE and the wiring switch SW.

The word driver WD2 is electrically connected to signal lines WL (signal lines WL21[0] and WL21[1] and signal lines WL22[0] and WL22[1] to signal lines WL2n[0] and WL2n[1]). The word driver WD2 has a function of transmitting a selection signal to each wiring switch SW and each LE through the signal lines WL.

The bit driver BD2 is electrically connected to signal lines BL (a signal line BL21 and a signal line BL22 to a signal line BL2n). The bit driver BD2 has a function of transmitting a signal corresponding to configuration data to each wiring switch SW through the respective signal lines BL. In addition, the bit driver BD2 has a function of transmitting the signal corresponding to configuration data to each LE through respective signal lines BL other than the signal lines BL in FIG. 6 (not shown).

The determination device 201 is electrically connected to the signal lines WL2 (the signal lines WL21[0] and WL21[1] to the signal lines WL2n[0] and WL2n[1]), the signal lines ND2 (the signal lines ND21O to ND2nO), and a signal line FINISH. The determination device 201 is electrically connected to the word driver WD2 and the bit driver BD2 through the signal line FINISH.

The determination device 201 has a function of determining whether a configuration is terminated or not in accordance with the signals transmitted from the signal lines WL2 and the signal lines ND2. The termination of the configuration is transmitted from the determination device 201 to the bit driver BD2 and the word driver WD2 through the signal line FINISH.

In addition, each wiring switch SW is electrically connected to a signal line CONTEXT (hereinafter also referred to as a signal line CONT) (not shown).

Figure 7:
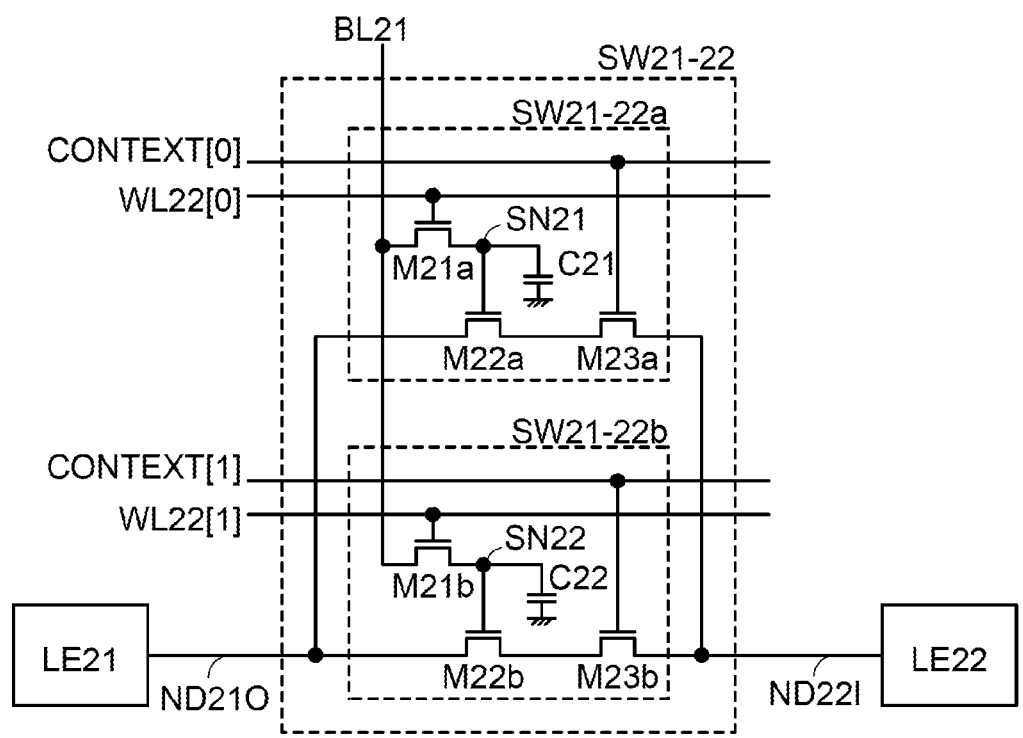
FIG. 7 shows a structure of a wiring switch.

FIG. 7 shows an example of a circuit of the wiring switch SW21-22. The wiring switch SW21-22 includes a switch SW21-22a and a switch SW21-22b. The wiring switch SW21-22 has a function of controlling conduction and non-conduction between the LE21 and the LE22.

The switch SW21-22a includes a transistor M21a, a transistor M22a, a transistor M23a, and a capacitor C21.

A gate of the transistor M21a is electrically connected to the signal line WL22[0]. One of a source and a drain of the transistor M21a is electrically connected to the signal line BL21. The other of the source and the drain of the transistor M21a is electrically connected to a gate of the transistor M22a and one electrode of the capacitor C21.

One of a source and a drain of the transistor M22a is electrically connected to the signal line ND21O and an output terminal of the LE 21. The other of the source and the drain of the transistor M22a is electrically connected to one of a source and a drain of the transistor M23a.

A gate of the transistor M23a is electrically connected to a signal line CONTEXT[0]. The other of the source and the drain of the transistor M23a is electrically connected to the signal line ND22I and an input terminal of the LE22.

The other electrode of the capacitor C21 is electrically connected to a power line and the like. In FIG. 7, the electrode is electrically connected to a wiring to which a reference potential (GND) is applied (e.g., a power line). To the wiring, a voltage that is different from GND may be applied as long as a constant voltage is applied.

The capacitor C21 is provided as needed.

A signal of the signal line WL22[0] controls an on state and an off state of the transistor M21a. Configuration data corresponding to the voltage of the signal line BL is written to and stored in the capacitor C21. The configuration data is also written to and stored in a node SN21.

The stored configuration data controls an on state and an off state of the transistor M22a.

A signal of the signal line CONTEXT[0] controls an on state and an off state of the transistor M23a.

The switch SW21-22b includes a transistor M21b, a transistor M22b, a transistor M23b, and a capacitor C22.

A gate of the transistor M21b is electrically connected to the signal line WL22[1]. One of a source and a drain of the transistor M21b is electrically connected to the signal line BL21. The other of the source and the drain of the transistor M21b is electrically connected to a gate of the transistor M22b and one electrode of the capacitor C22.

One of a source and a drain of the transistor M22b is electrically connected to the signal line ND21O and an output terminal of the LE 21. The other of the source and the drain of the transistor M22b is electrically connected to one of a source and a drain of the transistor M23b.

A gate of the transistor M23b is electrically connected to a signal line CONTEXT[1]. The other of the source and the drain of the transistor M23b is electrically connected to the signal line ND22I and an input terminal of the LE22.

The other electrode of the capacitor C22 is electrically connected to a power line and the like. In FIG. 7, the electrode is electrically connected to a wiring to which a reference potential (GND) is applied (e.g., a power line). To the wiring, a voltage that is different from GND may be applied as long as a constant voltage is applied.

The capacitor C22 is provided as needed.

A signal of the signal line WL22[1] controls an on state and an off state of the transistor M21b. Configuration data corresponding to the voltage of the signal line BL is written to and stored in the capacitor C22. The configuration data is also written to and stored in a node SN22.

The stored configuration data controls an on state and an off state of the transistor M22b.

A signal of the signal line CONTEXT[1] controls an on state and an off state of the transistor M23b.

The switch SW21-22a serves as a configuration memory by storing the voltage of the node SN21. The switch SW21-22b serves as a configuration memory by storing the voltage of the node SN22. An oxide semiconductor layer is used in each of the channel formation regions of the transistor M21a and the transistor M21b. The off-state current of a transistor including an oxide semiconductor layer is extremely small. Thus, the voltages of the node SN21 and the node SN22 can be stored.

In this embodiment, a first configuration memory refers to a switch SW2i-2ia, and a second configuration memory refers to a switch SW2i-2ib in some cases (i is an integer of 1 or more and n or less). Furthermore, first configuration data is referred to as configuration data stored in the switch SW2i-2ia, and second configuration data is referred to as configuration data stored in the switch SW2i-2ib. Moreover, configuration data stored in the switch SW21-21a to the switch SW2n-2na is collectively referred to as a first configuration data set, and configuration data stored in the switch SW21-21b to the switch SW2n-2nb is collectively referred to as a second configuration data set.

Here, the wiring switch SW21-22 is used as an example, and operation of the word driver WD2 and the bit driver BD2 is described.

The word driver WD2 has a function of selecting wiring switches SW through signal lines WL. To the wiring switch SW21-22, a selection signal is transmitted from the word driver WD2 through the signal line WL22[0] or the signal line WL22[1]. As described above, when the voltage of the signal line WL22[0] is at a high level, the transistor M21a is selected and is turned on, and when the voltage of the signal line WL22[1] is at a high level, the transistor M21b is selected and is turned on.

The bit driver BD2 has a function of transmitting a signal corresponding to configuration data to the wiring switch SW through the signal line BL. To the wiring switch SW21-22, the signal is transmitted from the bit driver BD2 through the signal line BL21. As described above, the signal corresponding to the configuration data is transmitted to one of the source and the drain of the transistor M21a or one of the source and the drain of the transistor M21b from the bit driver BD2 through the signal line BL21.

Furthermore, by the selection signal transmitted through the signal line CONTEXT, wiring switches SW are selected. Thus, conduction and non-conduction between the LEs can be controlled. In the wiring switch SW21-22, the selection signal is transmitted through the signal line CONTEXT[0] or the signal line CONTEXT[1]. As described above, when the voltage of the signal line CONTEXT[0] is at a high level, the transistor M23a is selected and is turned on, and when the voltage of the signal line CONTEXT[1] is at a high level, the transistor M23b is selected and is turned on. Thus, conduction and non-conduction between the LE21 and the LE22 can be controlled. As described above, the wiring switches SW have a function of transmitting data from an LE to another LE.

Figure 8:
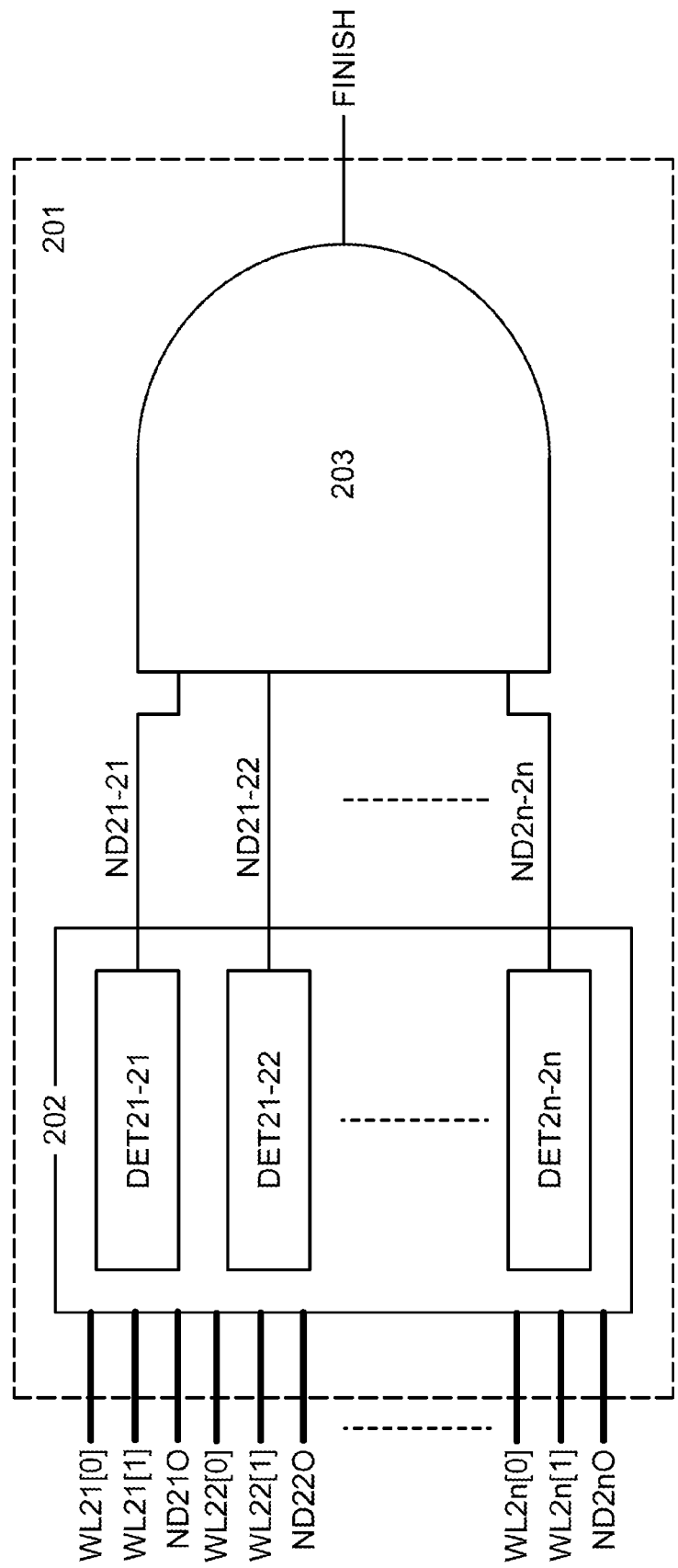
FIG. 8 shows a configuration of a determination circuit.

FIG. 8 shows an example of a block diagram of the determination device 201. The determination device 201 includes a determination circuit 202 and an AND circuit 203. The determination device 201 has a function of determining whether a configuration is terminated or not when a dynamic reconfiguration is performed.

The determination circuit 202 includes a determination circuit DET21-21 and a determination circuit DET21-22 to a determination circuit DET2n-2n.

The determination circuit 202 is electrically connected to the signal lines WL21[0] and WL21[1] to the signal lines WL2n[0] and WL2n[1]. The determination circuit 202 is also electrically connected to the signal lines ND21O to ND2nO.

The determination circuit 202 is electrically connected to a signal line ND21-21 and a signal line ND21-22 to a signal line ND2n-2n.

The AND circuit 203 is electrically connected to the signal lines ND21-21 to ND2n-2n.

The AND circuit 203 is electrically connected to the signal line FINISH.

The determination circuit 202 and the AND circuit 203 are described below.

Figure 9:
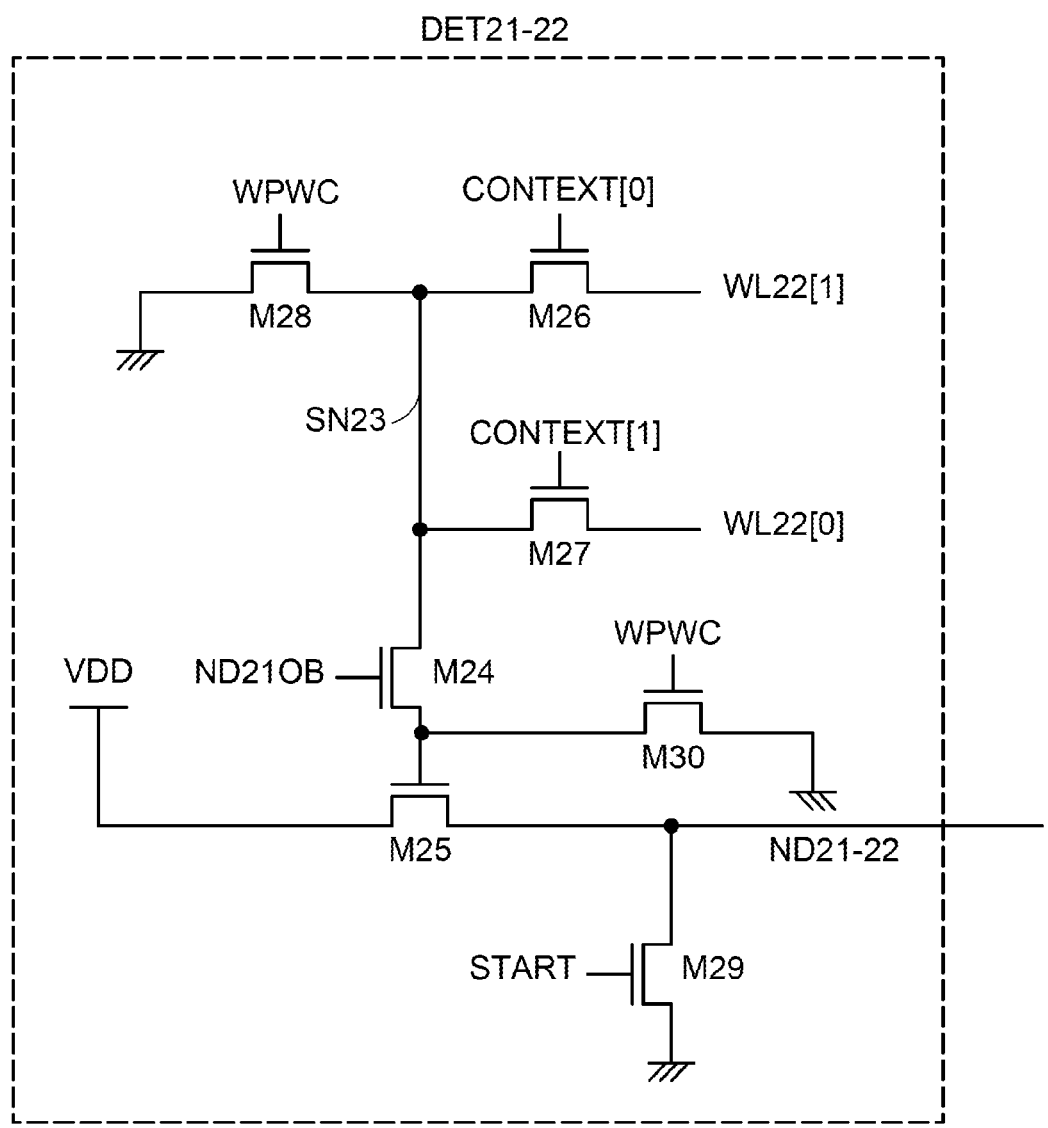
FIG. 9 shows a configuration of a determination circuit.

A circuit diagram of the determination circuit DET21-22 in the determination circuit 202 is shown as an example in FIG. 9.

The determination circuit DET21-22 includes a transistor M24, a transistor M25, a transistor M26, a transistor M27, a transistor M28, a transistor M29, and a transistor M30.

A gate of the transistor M28 is electrically connected to a signal line WPWC. One of a source and a drain of the transistor M28 is electrically connected to a power line. Here, a reference potential (GND) is applied to the power line; however, the voltage is not necessarily GND as long as a constant voltage is applied to the power line.

A gate of the transistor M30 is electrically connected to the signal line WPWC. One of a source and a drain of the transistor M30 is electrically connected to a power line. Here, a reference potential (GND) is applied to the power line; however, the voltage is not necessarily GND as long as a constant voltage is applied to the power line.

A high-level voltage is applied to the signal line WPWC when the signal lines WL are not selected, that is, all of the signal lines WL21[0] and WL21[1] to the signal lines WL2n[0] and WL2n[1] are at voltages at a low level. Then, the transistor M28 is turned on, and a reference potential is applied to the node SN23. The transistor M28 has a function of resetting the node SN23 while none of the signal lines WL is selected.

In addition, the transistor M30 is also turned on, and a reference potential is applied to a gate of the transistor M25. Accordingly, the transistor M25 is turned off. The transistor M30 has a function of making the transistor M25 off and resetting the transistor M25 while none of the signal lines WL is selected.

A gate of the transistor M24 is electrically connected to a signal line ND21OB. To the signal line ND21OB, an inversion signal of the signal line ND21O is applied.

A gate of the transistor M26 is electrically connected to the signal line CONTEXT[0]. One of a source and a drain of the transistor M26 is electrically connected to the signal line WL22[1]. The other of the source and the drain of the transistor M26 is electrically connected to the other of the source and the drain of the transistor M28. The other of the source and the drain of the transistor M26 is also electrically connected to one of a source and a drain of the transistor M24.

A gate of the transistor M27 is electrically connected to the signal line CONTEXT[1]. One of a source and a drain of the transistor M27 is electrically connected to the signal line WL22[0]. The other of the source and the drain of the transistor M27 is electrically connected to the other of the source and the drain of the transistor M28. The other of the source and the drain of the transistor M27 is also electrically connected to the one of the source and the drain of the transistor M24. The other of the source and the drain of the transistor M27 is also electrically connected to the other of the source and the drain of the transistor M26.

The other of the source and the drain of the transistor M24 is electrically connected to the gate of the transistor M25. The other of the source and the drain of the transistor M24 is also electrically connected to the other of the source and the drain of the transistor M30.

One of a source and a drain of the transistor M25 is electrically connected to a power line. A high-level voltage (here, VDD) is applied to the power line; however, the voltage is not necessarily VDD as long as a constant voltage is applied to the power line.

The other of the source and the drain of the transistor M25 is electrically connected to the signal line ND21-22.

A gate of the transistor M29 is electrically connected to a signal line START. One of a source and a drain of the transistor M29 is electrically connected to a power line. Here, a reference potential (GND) is applied to the power line; however, the voltage is not necessarily GND as long as a constant voltage is applied to the power line. The other of the source and the drain of the transistor M29 is electrically connected to the other of the source and the drain of the transistor M25. The other of the source and the drain of the transistor M29 is also electrically connected to the signal line ND21-22.

The transistor M29 has a function of resetting the signal line ND21-22 when a configuration is started. When the voltage of the signal line START is at a high level, the transistor M29 is turned on. A low-level voltage (here, GND) is applied to the one of the source and the drain of the transistor M29; thus, the low-level voltage is applied to the signal line ND21-22. Then, a low-level voltage is applied to the signal line START, and the transistor M29 is turned off.

Operation of the determination circuit DET21-22 is described.

The transistor M29 is already on, and a low-level voltage (GND) is applied to the signal line ND21-22. Then, the transistor M29 is turned off.

Furthermore, the transistor M28 is on, and a low-level voltage (GND) is applied to the node SN23. Then, the transistor M28 is turned off.

Moreover, the transistor M30 is on, and the gate voltage of the transistor M25 is reset (is at a low level) and the transistor M25 is off.

In the wiring switch SW21-22 (FIG. 7), the voltage of the signal line CONTEXT[0] is at a high level, and the voltage of the signal line CONTEXT[1] is at a low level. The transistor M23a is turned on and the transistor M23b is turned off.

When a low-level voltage is applied to the signal line ND21O, a high-level voltage is applied to the signal line ND21OB. The transistor M24 is turned on.

Since a low-level voltage is applied to the signal line ND21O, a configuration under Condition 1 is performed.

While the voltage of the signal line CONTEXT[0] is at a high level and the voltage of the signal line CONTEXT[1] is at a low level, a high-level voltage is applied to the signal line WL22[1]. The transistor M21b is turned on. Configuration data corresponding to the voltage of the signal line BL21 is written to and stored in the node SN22. Note that the transistor M27 is off.

At this time, the high-level voltage of the signal line CONTEXT[0] is applied to the gate of the transistor M26. The transistor M26 is turned on. Since the high-level voltage of the signal line WL22[1] is applied to the one of the source and the drain of the transistor M26, the high-level voltage is applied to the node SN23.

Since the transistor M24 is on, a high-level voltage is applied to the gate of the transistor M25. The transistor M25 is turned on.

A high-level voltage (VDD) is applied to the one of the source and the drain of the transistor M25; thus, the high-level voltage is applied to the signal line ND21-22.

Therefore, when the configuration under Condition 1 is performed, a high-level voltage is applied to the signal line ND21-22.

On the other hand, when a configuration under Condition 2 is performed, a high-level voltage is applied to the signal line ND21O and a low-level voltage is applied to the signal line ND21OB. The transistor M24 is off. Thus, since a high-level voltage is not applied to the gate of the transistor M25, the transistor M25 is off.

A low-level voltage (GND) is already applied to the signal line ND21-22. The voltage of the signal line ND21-22 is still at a low level because the transistor M25 is not turned on.

Therefore, when the configuration under Condition 2 is performed, a low-level voltage is applied to the signal line ND21-22.

When the configuration under Condition 1 is performed on the wiring switches SW21-21 to SW2n-2n, the voltages of the signal lines ND21-21 to ND2n-2n are all at a high level.

On the other hand, the configuration under Condition 2 is performed on a wiring switch SW, a high-level voltage is not applied to all of the signal lines ND21-21 to ND2n-2n.

Note that the voltages of the signal lines ND21-21 to ND2n-2n (at a high level or a low level) need to be stored. Thus, an oxide semiconductor layer is preferably used in each of the channel formation regions of the transistor M25 and the transistor M29. By using an oxide semiconductor layer in each of the channel formation regions of the transistor M25 and the transistor M29, when the transistor M25 and the transistor M29 are off, leakage current through the source and the drain is extremely small.

Figure 10:
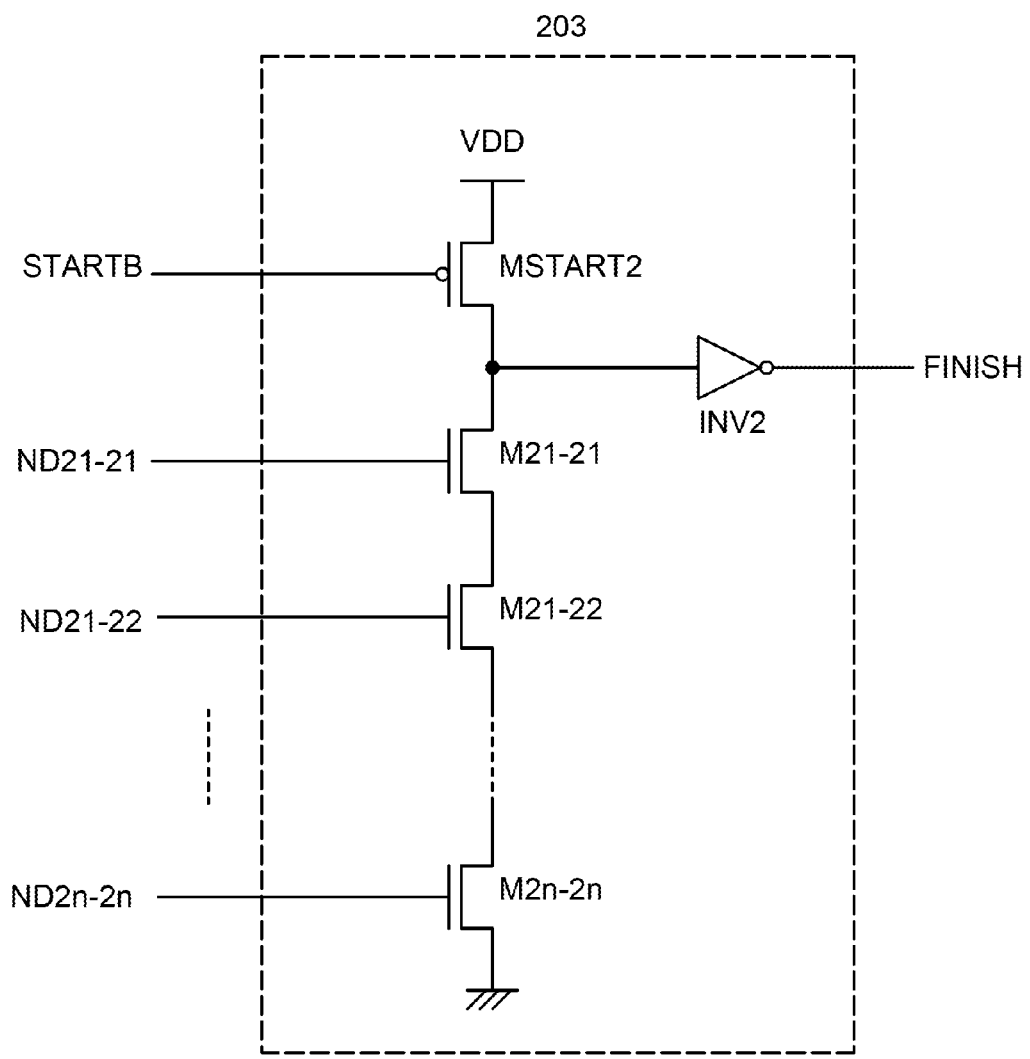
FIG. 10 shows a configuration example of an AND circuit.

FIG. 10 shows an example of a circuit diagram of the AND circuit 203.

The AND circuit 203 includes a transistor M21-21 and a transistor M21-22 to a transistor M2n-2n, a transistor MSTART2, and an inverter INV2. The AND circuit 203 has a function of outputting AND to an input.

The transistors M21-21 to M2n-2n and the transistor MSTART2 are connected in series.

A gate of the transistor MSTART2 is electrically connected to a signal line STARTB. One of a source and a drain of the transistor MSTART2 is electrically connected to a power line. Here, a voltage VDD is applied to the power line; however, the voltage is not necessarily VDD as long as a constant voltage is applied to the power line. The other of the source and the drain of the transistor MSTART2 is electrically connected to the inverter INV2.

A gate of the transistor M2n-2n is electrically connected to the signal line ND2n-2n. One of a source and a drain of the transistor M2n-2n is electrically connected to a power line. Here, a reference potential (GND) is applied to the power line; however, the voltage is not necessarily GND as long as a constant voltage is applied to the power line. The other of the source and the drain of the transistor M2n-2n is electrically connected to one of a source and a drain of a transistor M2n-(2n-1) (not illustrated).

A gate of the transistor M21-22 is electrically connected to the signal line ND21-22. One of a source and a drain of the transistor M21-22 is electrically connected to one of a source and a drain of the transistor M21-23 (not illustrated). The other of the source and the drain of the transistor M21-22 is electrically connected to one of a source and a drain of the transistor M21-21.

A gate of the transistor M21-21 is electrically connected to the signal line ND21-21. The one of the source and the drain of the transistor M21-21 is electrically connected to the other of the source and the drain of the transistor M21-22. The other of the source and the drain of the transistor M21-21 is electrically connected to the other of the source and the drain of the transistor MSTART2 and the inverter INV2.

The transistor MSTART2 has a function of resetting the signal line FINISH when a configuration is started.

To the signal line STARTB, an inversion signal of the signal line START is applied. Thus, a low-level voltage is applied to the signal line STARTB when a high-level voltage is applied to the signal line START and the signal line ND21-22 is reset.

When the voltage of the signal line STARTB is at a low level, the transistor MSTART2 is turned on. Since a high-level voltage (here, VDD) is applied to one of the source and the drain of the transistor MSTART2, a high-level voltage is applied to the inverter INV2. The inverter INV2 outputs a low-level voltage, and the low-level voltage is applied to the signal line FINISH. Then, a high-level voltage is applied to the signal line STARTB, and the transistor MSTART2 is turned off.

When the configuration under Condition 1 is performed on all of the wiring switches SW, a high-level voltage is stored in the signal lines ND21-21 to ND2n-2n. Accordingly, the transistors M21-21 to M2n-2n are turned on, and a low-level voltage (GND) is applied to the inverter INV2. The inverter INV2 outputs a high-level voltage. A high-level voltage is applied to the signal line FINISH.

The signal line FINISH is electrically connected to the word driver WD2 and the bit driver BD2 and transmits termination of the configuration (a high-level voltage) to the word driver WD2 and the bit driver BD2.

When the configuration under Condition 2 is performed on any of the wiring switches SW, a low-level voltage is stored in the signal lines ND21-21 to ND2n-2n. Accordingly, a high-level voltage (VDD) is applied to the inverter INV2; thus, the inverter INV2 outputs a low-level voltage. A low-level voltage is applied to the signal line FINISH.

The signal line FINISH transmits a signal indicating that the configuration has not been completed (a low-level voltage) to the word driver WD2 and the bit driver BD2.

The structure of the determination device 201 is not limited to that of this embodiment as long as the determination device 201 can determinate whether the configuration of the wiring switch SW is performed under Condition 1 or Condition 2.

Figure 11:
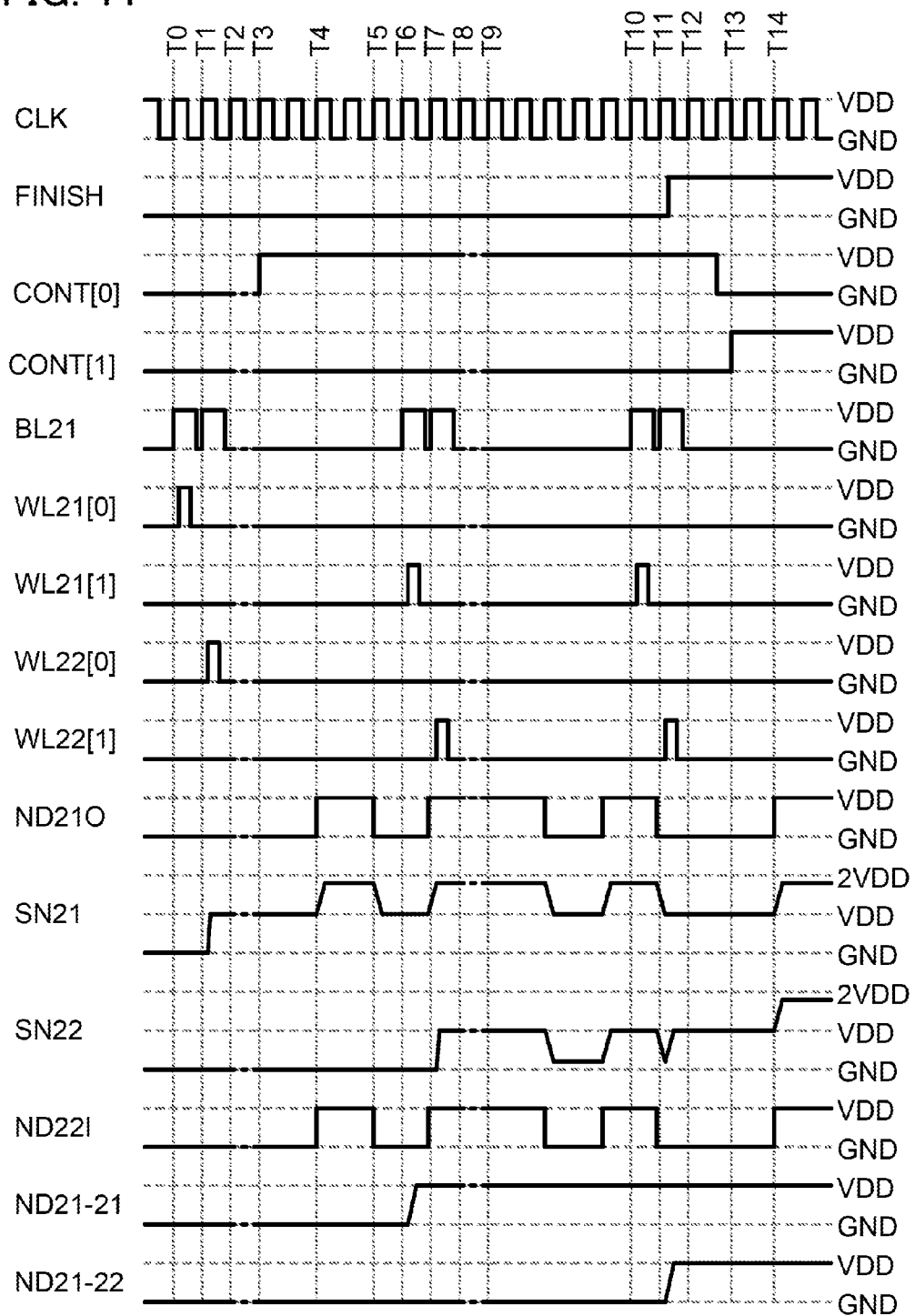
FIG. 11 shows a timing chart.

FIG. 11 shows an example of a timing chart.

When the second configuration memory is dynamically reconfigured, the configuration under Condition 2 is performed only on the switch SW21-22b in the first configuration. Then, in the second configuration, the configuration under Condition 1 is performed on the switch SW21-22b.

From Time T0 to Time T3, an initial configuration is performed on the first configuration memory.

<Before Time T0>

By the voltage of the signal line START, the transistor M29 is turned on, a low-level voltage is applied to the signal line ND21-22. By the voltage of the signal line STARTB, the transistor MSTART2 is turned on, the output of the inverter INV2 is at a low level, and the voltage of the signal line FINISH is at a low level.

The voltages of all of the signal lines WL are at a low level, the voltage of the signal line WPWC is at a high level and the transistor M28 is turned on, and a low-level voltage is applied to the node SN23.

Moreover, the transistor M30 is turned on, the gate voltage of the transistor M25 is at a low level, and the transistor M25 is turned off.

<Time T0 to Time T1>

While the voltage of the signal line ND21O is at a low level, the voltage of the signal line BL21 is at a high level and the voltage of the signal line WL21[0] is at a high level. The configuration under Condition 1 is performed on the switch SW21-21a.

<Time T1 to Time T2>

While the voltage of the signal line ND21O is at a low level, the voltage of the signal line BL21 is at a high level and the voltage of the signal line WL22[0] is at a high level. The transistor M21a in the switch SW21-22a is turned on, and configuration data corresponding to a high level is written to the capacitor C21. The configuration data corresponding to a high level is also written to the node SN21.

After that, the voltage of the signal line WL22[0] is set to a low level, and the voltage of the signal line BL21 is set to a low level. The transistor M21a is turned off. The configuration data is stored in the node SN21. Thus, the configuration under Condition 1 is performed on the switch SW21-22a.

<Time T2 to Time T3>

Desired configuration data is written to and stored in the other wiring switches SW.

<Time T3>

The voltage of the signal line CONTEXT[0] (also referred to as CONT[0] in FIG. 11) is set to a high level. The transistor M23a in the switch SW21-22a is turned on. Thus, the first configuration memory is selected.

<Time T4>

The voltage of the signal line ND21O is changed from a low level to a high level. Owing to capacitive coupling via gate capacitance of the transistor M22a, the voltage of the node SN21 is boosted close to 2VDD, for example. Thus, the voltage of the signal line ND22I becomes a high level rapidly. Then, the signal-transmission speed between the signal line ND21O and the signal line ND22I, that is, between the LE21 and the LE22, through the wiring switch SW21-22 is improved.

<Time T5>

The voltage of the signal line ND21O is changed from a high level to a low level. Owing to capacitive coupling via gate capacitance of the transistor M22a, the voltage of the node SN21 is lowered to VDD. The voltage between the source and the gate of the transistor M22a is VDD and the transistor M22a is still on; thus, the voltage of the signal line ND22I becomes a low level rapidly.

From Time T6 to Time T9, a first dynamic reconfiguration, that is, a configuration of the second configuration memory is performed.

<Time T6 to Time T7>

While the voltage of the signal line ND21O is at a low level, the voltage of the signal line BL21 is at a high level and the voltage of the signal line WL21[1] is at a high level. The configuration under Condition 1 is performed on the switch SW21-21b. Then, a high-level voltage is applied to and stored in the signal line ND21-21.

<Time T7 to Time T8>

While the voltage of the signal line ND21O is at a high level, the voltage of the signal line BL21 is set to a high level and the voltage of the signal line WL22[1] is set to a high level. Configuration data corresponding to a high level is written to the capacitor C22. The configuration data corresponding to a high level is also written to the node SN22.

At this time, the voltage of the signal line CONTEXT[0] is at a high level, so that the transistor M26 is turned on.

The voltage of the signal line ND21O is at a high level; thus, the voltage of the signal line ND21OB is at a low level, and the transistor M24 is off. Furthermore, the transistor M25 is off.

By a reset, the voltage of the signal line ND21-22 is at a low level: thus, the voltage of the signal line ND21-22 is still at a low level.

After that, the voltage of the signal line WL22[1] is set to a low level, and the voltage of the signal line BL21 is set to a low level. The transistor M21b is turned off. The configuration data is stored in the node SN22. Thus, the configuration under Condition 2 is performed on the switch SW21-22b.

<Time T8 to Time T9>

The configuration under Condition 1 is performed on the other wiring switches SW.

Since the voltage of the signal line ND21-22 is at a low level, the AND circuit 203 outputs a low-level voltage, and the voltage of the signal line FINISH is set to a low level. This shows that the configuration is not terminated. Thus, the configuration is performed again.

From Time T10 to Time T12, a second dynamic reconfiguration, that is, a configuration of the second configuration memory is performed.

<Time T10 to Time T11>

While the voltage of the signal line ND21O is at a high level, a high-level voltage is applied to the signal line BL21, and a high-level voltage is applied to the signal line WL21[1]. The configuration under Condition 2 is performed on the switch SW21-21b.

However, from Time T6 to Time T7, the configuration under Condition 1 is performed on the switch SW21-21b in the first dynamic reconfiguration. Thus, the signal-transmission speed through the switch SW21-21b is not lowered.

<Time T11 to Time T12>

While the voltage of the signal line ND21O is at a low level, the voltage of the signal line BL21 is at a high level and the voltage of the signal line WL22[1] is at a high level. Configuration data corresponding to a high level is written to the capacitor C22. The configuration data corresponding to a high level is also written to the node SN22.

At this time, a high-level voltage is applied to the signal line CONTEXT[0], so that the transistor M26 is turned on. Since the voltage (at a high level) of the signal line WL22[1] is applied to one of the source and the drain of the transistor M26, the voltage of the node SN23 is set to a high level.

The voltage of the signal line ND21O is at a low level; thus, the voltage of the signal line ND21OB is set to a high level, and the transistor M24 is turned on. Since a high-level voltage is applied to the node SN23, the gate voltage of the transistor M25 is set to a high level, and the transistor M25 is turned on. To one of the source and the drain of the transistor M25, VDD is applied; thus, the voltage of the signal line ND21-22 is set to a high level.

After that, the voltage of the signal line WL22[1] is set to a low level, and the voltage of the signal line BL21 is set to a low level. The transistor M21$b$ is turned off. The configuration data is stored in the node SN22. Thus, the configuration under Condition 1 is performed on the switch SW21-22$b$.

The configuration under Condition 1 is already performed on the other wiring switches SW from Time T8 to Time T9; thus, the configuration under Condition 1 is performed on all of the wiring switches SW.

Since the voltages of the signal line ND21-21, the signal line ND21-22, and the signal line ND2$n$-2$n$ are each at a high level, the AND circuit 203 outputs a high-level voltage, the voltage of the signal line FINISH is set to a high level, and the configuration of the second configuration memory of each of the switches SW21-21 to SW2$n$-2$n$ is terminated.

<Time T12 to Time T13>

The voltage of the signal line CONTEXT[0] is set to a low level, and the voltage of the signal line CONTEXT[1] (also referred to as CONT[1] in FIG. 11) is set to a high level. In the wiring switch SW21-22, the transistor M23$a$ is turned off, and the transistor M23$b$ is turned on. Thus, the second configuration memory is selected.

<Time T14>

The voltage of the signal line ND21O is changed from a low level to a high level. Owing to capacitive coupling via gate capacitance of the transistor M22$b$, the voltage of the node SN22 is boosted close to 2VDD, for example. Thus, the voltage of the signal line ND22I becomes a high level rapidly. That is, the signal-transmission speed between the signal line ND21O and the signal line ND22I through the wiring switch SW21-22 is improved.

When the dynamic reconfiguration is performed, configurations are repeatedly performed on all of the wiring switches SW until the configuration under Condition 1 is performed, whereby the signal-transmission speed through the wiring switch SW is not lowered.

Embodiment 4

Figure 17:
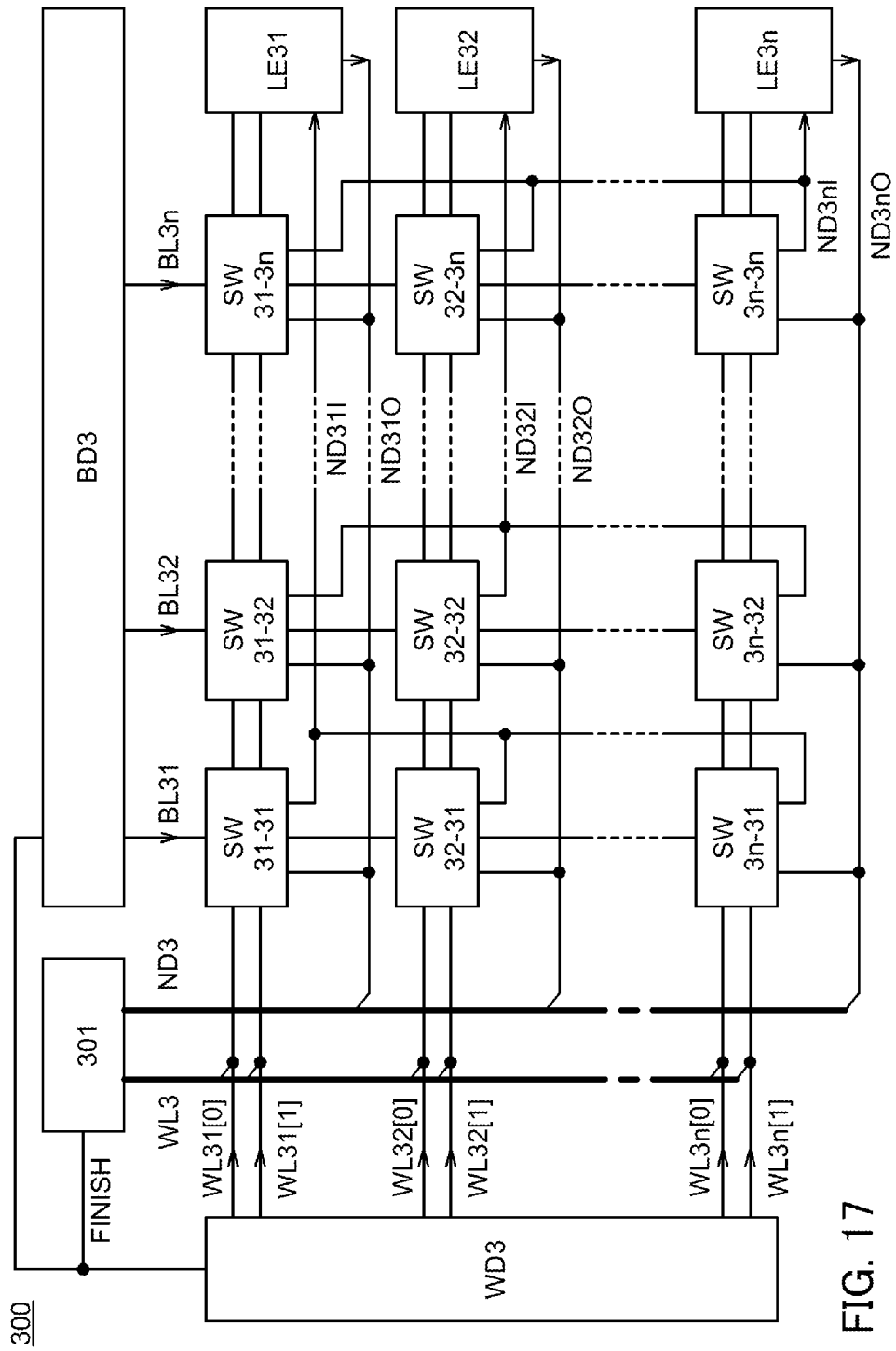
FIG. 17 shows a structure of a PLD.

FIG. 17 shows an example of a schematic block diagram of a PLD 300.

The PLD 300 includes LEs, wiring switches SW, a word driver WD3, a bit driver BD3, and a determination device 301.

The LEs include an LE31 and an LE32 to an LE3$n$. Note that n is a natural number.

The LEs include configuration memories. Each LE has a function of outputting a certain output signal function of an input signal, depending on configuration data stored in the configuration memory. The input signals are input to the respective LEs through a signal line ND31I and a signal line ND32I to a signal line ND3$n$I. The output signals are output from the respective LEs through a signal line ND31O and a signal line ND32O to a signal line ND3$n$O.

The wiring switches SW include, in the column direction, a wiring switch SW31-31 and a wiring switch SW31-32 to a wiring switch SW31-3$n$, a wiring switch SW32-31 and a wiring switch SW32-32 to a wiring switch SW32-3$n$, and a wiring switch SW3$n$-31 and a wiring switch SW3$n$-32 to a wiring switch SW3$n$-3$n$.

The wiring switch SW has a function of controlling a conduction state between the LEs. Furthermore, each of the wiring switches SW includes a memory that can store configuration data.

The word driver WD3 and the bit driver BD3 have a function of controlling configurations of the LE and the wiring switch SW.

The word driver WD3 is electrically connected to signal lines WL (signal lines WL31[0] and WL31[1] and signal lines WL32[0] and WL32[1] to signal lines WL3$n$[0] and WL3$n$[1]). The word driver WD3 has a function of transmitting selection signals to the wiring switches SW and the logical elements LE through the signal lines WL.

Note that two signal lines WL are electrically connected to each of the wiring switches SW.

For example, to each of the wiring switch SW31-31 to the wiring switch SW31-3$n$, selection signals are transmitted from the signal line WL31[0] and the signal line WL31[1].

Furthermore, to each of the wiring switch SW32-31 to the wiring switch SW32-3$n$, selection signals are transmitted from the signal line WL32[0] and the signal line WL32[1].

Furthermore, to each of the wiring switch SW3$n$-31 to the wiring switch SW3$n$-3$n$, selection signals are transmitted from the signal line WL3$n$[0] and the signal line WL3$n$[1].

Note that output signals from the logic elements LE are input to the wiring switches SW.

For example, to each of the wiring switch SW31-31 to the wiring switch SW31-3$n$, an output signal from the LE31 is transmitted through the signal line ND31O.

Furthermore, to each of the wiring switch SW32-31 to the wiring switch SW32-3$n$, an output signal from the LE32 is transmitted through the signal line ND32O.

Furthermore, to each of the wiring switch SW3$n$-31 to the wiring switch SW3$n$-3$n$, an output signal from the LE3$n$ is transmitted through the signal line ND3$n$O.

Thus, to the wiring switches SW electrically connected to the two signal lines WL3$n$[0] and WL3$n$[1], one signal line ND3$n$O is electrically connected. In other words, to the wiring switches SW that are common in a point that signals from the two signal lines WL3$n$[0] and WL3$n$[1] are transmitted to, a signal is transmitted from one common signal line ND3$n$O. The PLD 300 is different from the PLD 200 in that point. In this manner, the number of the determination circuits 302 can be reduced to n. Thus, when the determination circuits 302 are formed on a substrate, an area occupied by the determination circuits 302 can be small. Note that in the PLD 200, the number of the determination circuits 202 is n×n, specifically, the same as the number of the wiring switches SW. This will be described later.

For example, to each of the wiring switch SW31-31 to the wiring switch SW31-3$n$, selection signals are transmitted from the signal lines WL31[0] and WL31[1], and an output signal from the LE31 is transmitted through the signal line ND31O.

To each of the wiring switch SW32-31 to the wiring switch SW32-3n, selection signals are transmitted from the signal lines WL32[0] and WL32[1], and an output signal from the LE32 is transmitted through the signal line ND32O.

The bit driver BD3 is electrically connected to signal lines BL (a signal line BL31 and a signal line BL32 to a signal line BL3n). The bit driver BD3 has a function of transmitting a signal corresponding to configuration data to each wiring switch SW through the respective signal lines BL. In addition, the bit driver BD3 has a function of transmitting the signal corresponding to configuration data to each LE through respective signal lines BL other than the signal lines BL in FIG. 17 (not shown).

The determination device 301 is electrically connected to the signal lines WL3 (electrically connected to the signal lines WL31[0] and WL31[1] to the signal lines WL3n[0] and WL3n[1]), the signal lines ND3 (electrically connected to the signal lines ND31O to ND3nO), and a signal line FINISH. The determination device 301 is electrically connected to the word driver WD3 and the bit driver BD3 through the signal line FINISH.

The determination device 301 has a function of determining whether a configuration is terminated or not in accordance with the signals transmitted from the signal lines WL3 and the signal lines ND3. The termination of the configuration is transmitted from the determination device 301 to the bit driver BD3 and the word driver WD3 through the signal line FINISH.

In addition, each wiring switch SW is electrically connected to a signal line CONTEXT (hereinafter also referred to as a signal line CONT) (not shown).

Figure 18:
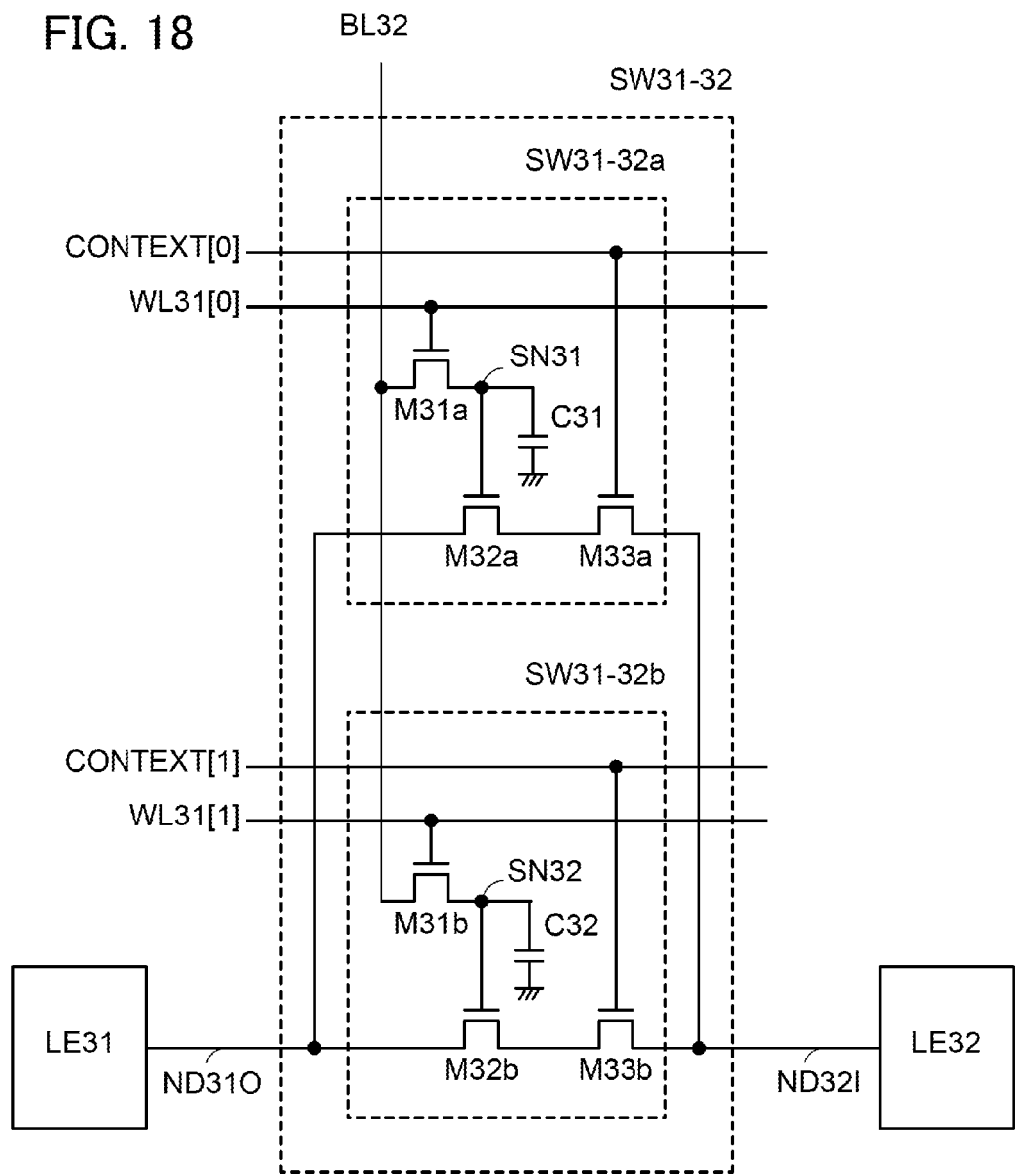
FIG. 18 shows a structure of a wiring switch.

FIG. 18 shows an example of a circuit of the wiring switch SW31-32. The wiring switch SW31-32 includes a switch SW31-32a and a switch SW31-32b. The wiring switch SW31-32 has a function of controlling conduction and non-conduction between the LE31 and the LE32.

The switch SW31-32a includes a transistor M31a, a transistor M32a, a transistor M33a, and a capacitor C31.

A gate of the transistor M31a is electrically connected to the signal line WL31[0]. One of a source and a drain of the transistor M31a is electrically connected to the signal line BL32. The other of the source and the drain of the transistor M31a is electrically connected to a gate of the transistor M32a and one electrode of the capacitor C31.

One of a source and a drain of the transistor M32a is electrically connected to the signal line ND31O and an output terminal of the LE31. The other of the source and the drain of the transistor M32a is electrically connected to one of a source and a drain of the transistor M33a.

A gate of the transistor M33a is electrically connected to a signal line CONTEXT[0]. The other of the source and the drain of the transistor M33a is electrically connected to the signal line ND32I and an input terminal of the LE32.

The other electrode of the capacitor C31 is electrically connected to a power line and the like. In FIG. 18, the electrode is electrically connected to a wiring to which a reference potential (GND) is applied (e.g., a power line). To the wiring, a voltage that is different from GND may be applied as long as a constant voltage is applied.

The capacitor C31 is provided as needed.

A signal of the signal line WL31[0] controls an on state and an off state of the transistor M31a. Configuration data corresponding to the voltage of the signal line BL32 is written to and stored in the capacitor C31. The configuration data is also written to and stored in a node SN31.

The stored configuration data controls an on state and an off state of the transistor M32a.

A signal of the signal line CONTEXT [0] controls an on state and an off state of the transistor M33a.

The switch SW31-32b includes a transistor M31b, a transistor M32b, a transistor M33b, and a capacitor C32.

A gate of the transistor M31b is electrically connected to the signal line WL31[1]. One of a source and a drain of the transistor M31b is electrically connected to the signal line BL32. The other of the source and the drain of the transistor M31b is electrically connected to a gate of the transistor M32b and one electrode of the capacitor C32.

One of a source and a drain of the transistor M32b is electrically connected to the signal line ND31O and an output terminal of the LE31. The other of the source and the drain of the transistor M32b is electrically connected to one of a source and a drain of the transistor M33b.

A gate of the transistor M33b is electrically connected to a signal line CONTEXT[1]. The other of the source and the drain of the transistor M33b is electrically connected to the signal line ND32I and an input terminal of the LE32.

The other electrode of the capacitor C32 is electrically connected to a power line and the like. In FIG. 18, the electrode is electrically connected to a wiring to which a reference potential (GND) is applied (e.g., a power line). To the wiring, a voltage that is different from GND may be applied as long as a constant voltage is applied.

The capacitor C32 is provided as needed.

A signal of the signal line WL31[1] controls an on state and an off state of the transistor M31b. Configuration data corresponding to the voltage of the signal line BL is written to and stored in the capacitor C32. The configuration data is also written to and stored in a node SN32.

The stored configuration data controls an on state and an off state of the transistor M32b.

A signal of the signal line CONTEXT[1] controls an on state and an off state of the transistor M33b.

The switch SW31-32a serves as a configuration memory by storing the voltage of the node SN31. The switch SW31-32b serves as a configuration memory by storing the voltage of the node SN32. An oxide semiconductor layer is used in each of the channel formation regions of the transistor M31a and the transistor M31b. The off-state current of a transistor including an oxide semiconductor layer is extremely small. Thus, the voltages of the node SN31 and the node SN32 can be stored.

In this embodiment, a first configuration memory refers to a switch SW3i-3ia, and a second configuration memory refers to a switch SW3i-3ib in some cases (i is an integer of 1 or more and n or less). Furthermore, first configuration data is referred to as configuration data stored in the switch SW3i-3ia, and second configuration data is referred to as configuration data stored in the switch SW3i-3ib. Moreover, configuration data stored in the switch SW31-31a to the switch SW3n-3na is collectively referred to as a first configuration data set, and configuration data stored in the switch SW31-31b to the switch SW3n-3nb is collectively referred to as a second configuration data set.

Here, the wiring switch SW31-32 is used as an example, and operation of the word driver WD3 and the bit driver BD3 is described.

The word driver WD3 has a function of selecting the wiring switch SW through the signal line WL. To the wiring switch SW31-32, a selection signal is transmitted from the word driver WD3 through the signal line WL31[0] or the signal line WL31[1]. As described above, when the voltage of the signal line WL31[0] is at a high level, the transistor M31a is selected and is turned on, and when the voltage of the signal line WL31[1] is at a high level, the transistor M31*b* is selected and is turned on.

The bit driver BD3 has a function of transmitting a signal corresponding to configuration data to the wiring switch SW through the signal line BL. To the wiring switch SW31-32, the signal is transmitted from the bit driver BD3 through the signal line BL32. As described above, the signal corresponding to the configuration data is transmitted to one of the source and the drain of the transistor M31*a* or one of the source and the drain of the transistor M31*b* from the bit driver BD3 through the signal line BL32.

Furthermore, by the selection signal transmitted through the signal line CONTEXT, wiring switches SW are selected. Thus, conduction and non-conduction between the LEs can be controlled. In the wiring switch SW31-32, the selection signal is transmitted through the signal line CONTEXT[0] or the signal line CONTEXT[1]. As described above, when the voltage of the signal line CONTEXT[0] is at a high level, the transistor M33*a* is selected and is turned on, and when the voltage of the signal line CONTEXT[1] is at a high level, the transistor M33*b* is selected and is turned on. Thus, conduction and non-conduction between the LE31 and the LE32 can be controlled. As described above, the wiring switch SW has a function of transmitting data from an LE to another LE.

Figure 19:
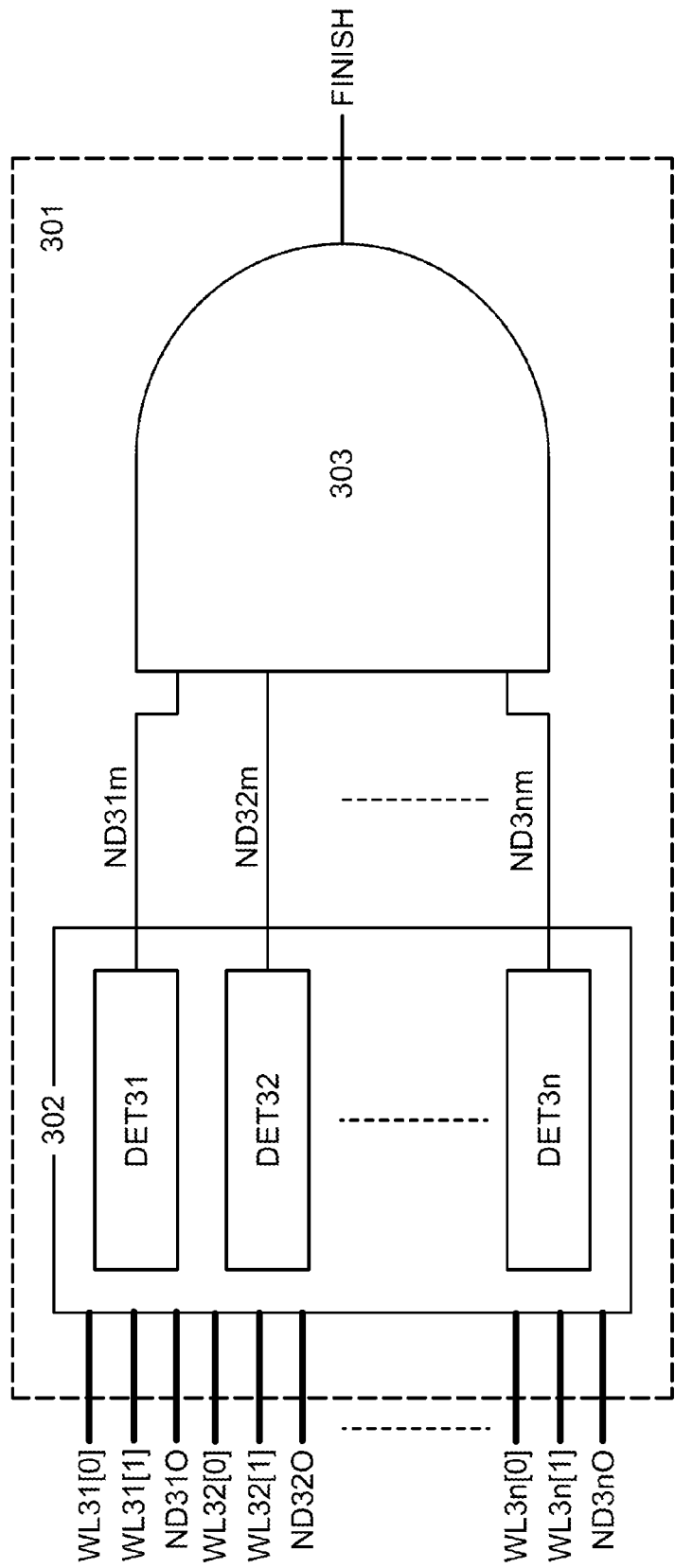
FIG. 19 shows a configuration of a determination circuit.

FIG. 19 shows an example of a block diagram of the determination device 301. The determination device 301 includes a determination circuit 302 and an AND circuit 303. The determination device 301 has a function of determining whether a configuration is terminated or not when a dynamic reconfiguration is performed.

The determination circuit 302 includes a determination circuit DET31 and a determination circuit DET32 to a determination circuit DET3*n*.

The determination circuit 302 is electrically connected to the signal lines WL31[0] and WL31[1] to the signal lines WL3*n*[0] and WL3*n*[1]. The determination circuit 302 is also electrically connected to the signal lines ND31O to ND3*n*O.

The determination circuit 302 is electrically connected to a signal line ND31*m* and a signal line ND32*m* to a signal line ND3*nm*.

The AND circuit 303 is electrically connected to the signal lines ND3*m* to ND3*nm*.

The AND circuit 303 is electrically connected to the signal line FINISH.

The determination circuit 302 and the AND circuit 303 are described below.

Figure 20:
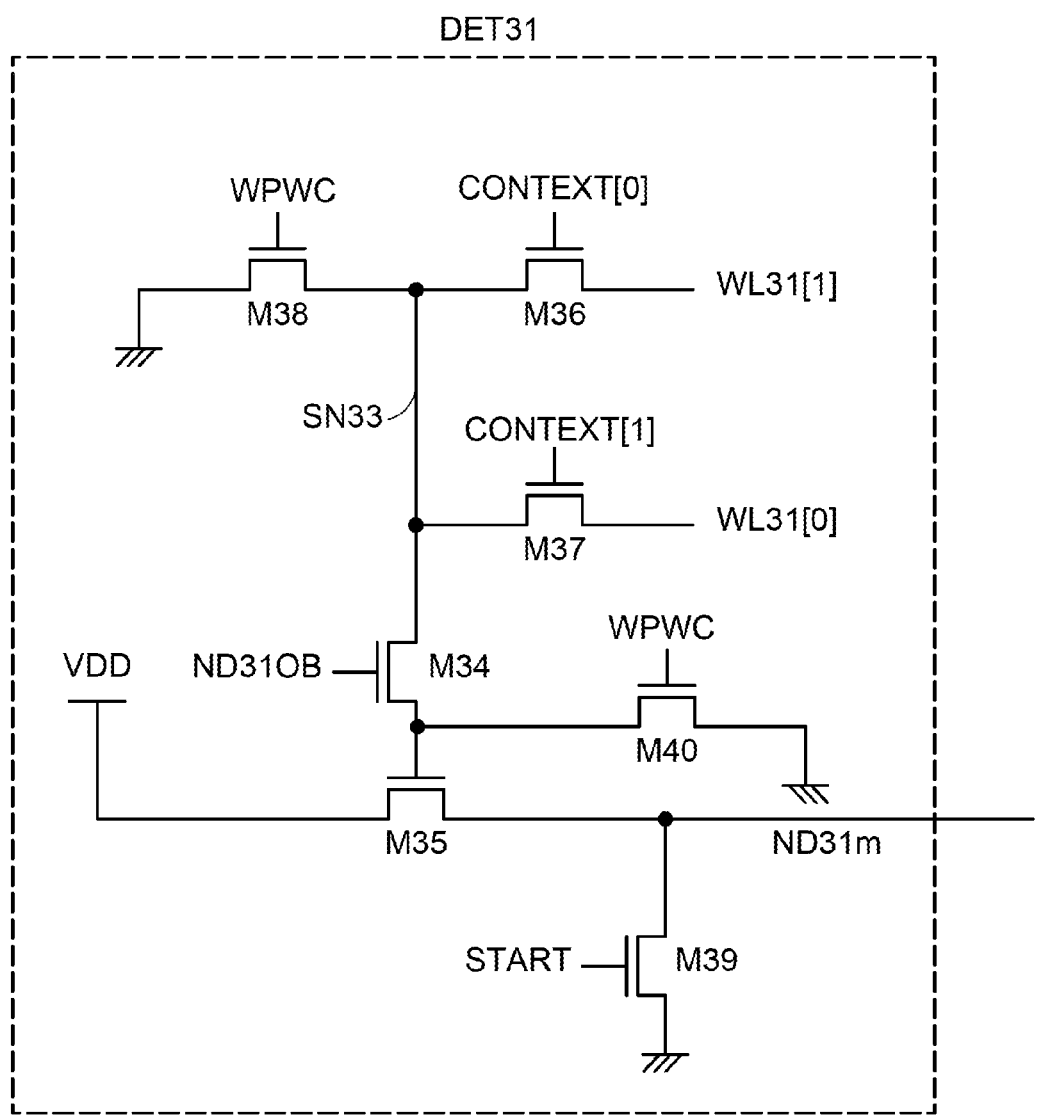
FIG. 20 shows a configuration of a determination circuit.

A circuit diagram of the determination circuit DET31 in the determination circuit 302 is shown as an example in FIG. 20.

The determination circuit DET31 includes a transistor M34, a transistor M35, a transistor M36, a transistor M37, a transistor M38, a transistor M39, and a transistor M40.

A gate of the transistor M38 is electrically connected to a signal line WPWC. One of a source and a drain of the transistor M38 is electrically connected to a power line. Here, a reference potential (GND) is applied to the power line; however, the voltage is not necessarily GND as long as a constant voltage is applied to the power line.

A gate of the transistor M40 is electrically connected to the signal line WPWC. One of a source and a drain of the transistor M40 is electrically connected to a power line. Here, a reference potential (GND) is applied to the power line; however, the voltage is not necessarily GND as long as a constant voltage is applied to the power line.

A high-level voltage is applied to the signal line WPWC when the signal lines WL are not selected, that is, all of the signal lines WL31[0] and WL31[1] to the signal lines WL3*n*[0] and WL3*n*[1] are at voltages at a low level. Then, the transistor M38 is turned on, and a reference potential is applied to the node SN33. The transistor M38 has a function of resetting the node SN33 while the signal lines WL are not selected.

In addition, the transistor M40 is also turned on, and a reference potential is applied to a gate of the transistor M35. Accordingly, the transistor M35 is turned off. The transistor M40 has a function of making the transistor M35 off and resetting the transistor M35 while none of the signal lines WL is selected.

A gate of the transistor M34 is electrically connected to a signal line ND31OB. To the signal line ND31OB, an inversion signal of the signal line ND31O is applied.

A gate of the transistor M36 is electrically connected to the signal line CONTEXT[0]. One of a source and a drain of the transistor M36 is electrically connected to the signal line WL31[1]. The other of the source and the drain of the transistor M36 is electrically connected to the other of the source and the drain of the transistor M38. The other of the source and the drain of the transistor M36 is also electrically connected to one of a source and a drain of the transistor M34.

A gate of the transistor M37 is electrically connected to the signal line CONTEXT[1]. One of a source and a drain of the transistor M37 is electrically connected to the signal line WL31[0]. The other of the source and the drain of the transistor M37 is electrically connected to the other of the source and the drain of the transistor M38. The other of the source and the drain of the transistor M37 is also electrically connected to the one of the source and the drain of the transistor M34. The other of the source and the drain of the transistor M37 is also electrically connected to the other of the source and the drain of the transistor M36.

The other of the source and the drain of the transistor M34 is electrically connected to the gate of the transistor M35. The other of the source and the drain of the transistor M34 is also electrically connected to the other of the source and the drain of the transistor M40.

One of a source and a drain of the transistor M35 is electrically connected to a power line. A high-level voltage (here, VDD) is applied to the power line; however, the voltage is not necessarily VDD as long as a constant voltage is applied to the power line.

The other of the source and the drain of the transistor M35 is electrically connected to the signal line ND31*m*.

A gate of the transistor M39 is electrically connected to a signal line START. One of a source and a drain of the transistor M39 is electrically connected to a power line. Here, a reference potential (GND) is applied to the power line; however, the voltage is not necessarily GND as long as a constant voltage is applied to the power line. The other of the source and the drain of the transistor M39 is electrically connected to the other of the source and the drain of the transistor M35. The other of the source and the drain of the transistor M39 is also electrically connected to the signal line ND31*m*.

The transistor M39 has a function of resetting the signal line ND31*m* when a configuration is started. When the voltage of the signal line START is at a high level, the transistor M39 is turned on. A low-level voltage (here, GND) is applied to the one of the source and the drain of the transistor M39; thus, the low-level voltage is applied to the signal line ND31*m*. Then, a low-level voltage is applied to the signal line START, and the transistor M39 is turned off.

Operation of the determination circuit DET31 is described.

The transistor M39 is already on, and a low-level voltage (GND) is applied to the signal line ND31*m*. Then, the transistor M39 is turned off.

Furthermore, the transistor M38 is on, and a low-level voltage (GND) is applied to the node SN33. Then, the transistor M38 is turned off.

Moreover, the transistor M40 is on, and the gate voltage of the transistor M35 is reset (is at a low level) and the transistor M35 is off.

In the wiring switch SW31-32 (FIG. 18), the voltage of the signal line CONTEXT[0] is at a high level, and the voltage of the signal line CONTEXT[1] is at a low level. The transistor M33a is turned on and the transistor M33b is turned off.

When a low-level voltage is applied to the signal line ND31O, a high-level voltage is applied to the signal line ND31OB. The transistor M34 is turned on.

Since a low-level voltage is applied to the signal line ND31O, a configuration under Condition 1 is performed.

While the voltage of the signal line CONTEXT[0] is at a high level and the voltage of the signal line CONTEXT[1] is at a low level, a high-level voltage is applied to the signal line WL31[1]. The transistor M31b is turned on. Configuration data corresponding to the voltage of the signal line BL32 is written to and stored in the node SN32. Note that the transistor M37 is off.

At this time, the high-level voltage of the signal line CONTEXT[0] is applied to the gate of the transistor M36. The transistor M36 is turned on. Since the high-level voltage of the signal line WL31[1] is applied to the one of the source and the drain of the transistor M36, the high-level voltage is applied to the node SN33.

Since the transistor M34 is on, a high-level voltage is applied to the gate of the transistor M35. The transistor M35 is turned on.

A high-level voltage (VDD) is applied to the one of the source and the drain of the transistor M35; thus, the high-level voltage is applied to the signal line ND31m.

Therefore, when the configuration under Condition 1 is performed, a high-level voltage is applied to the signal line ND31m.

On the other hand, when a configuration under Condition 2 is performed, a high-level voltage is applied to the signal line ND31O and a low-level voltage is applied to the signal line ND31OB. The transistor M34 is off. Thus, since a high-level voltage is not applied to the gate of the transistor M35, the transistor M35 is off.

A low-level voltage (GND) is already applied to the signal line ND31m. The voltage of the signal line ND31m is still at a low level because the transistor M35 is not turned on.

Therefore, when the configuration under Condition 2 is performed, a low-level voltage is applied to the signal line ND31m.

When the configuration under Condition 1 is performed on the wiring switches SW31-31 to SW3n-31, the voltages of the signal lines ND31m to ND3nm are all at a high level.

On the other hand, the configuration under Condition 2 is performed on a wiring switch SW, none of the voltages of the signal lines ND31m to ND3nm is at a high level.

Note that the voltages of the signal lines ND31m to ND3nm (at a high level or a low level) need to be stored. Thus, an oxide semiconductor layer is preferably used in each of the channel formation regions of the transistor M35 and the transistor M39. By using an oxide semiconductor layer in each of the channel formation regions of the transistor M35 and the transistor M39, when the transistor M35 and the transistor M39 are off, leakage current through the source and the drain is extremely small.

To the wiring switches SW31-31 to SW31-3n, the signal line WL31[0], the signal line WL31[1], and the signal line ND31O are common (FIG. 17). Thus, a configuration can be performed at once. Then, the determination circuit DET31 determines whether the configuration is performed under Condition 1 or Condition 2 at once.

To the wiring switches SW32-31 to SW32-3n, the signal line WL32[0], the signal line WL32[1], and the signal line ND32O are common (FIG. 17). Thus, a configuration can be performed at once. Then, the determination circuit DET32 determines whether the configuration is performed under Condition 1 or Condition 2 at once.

To the wiring switches SW3n-31 to SW3n-3n, the signal line WL3n[0], the signal line WL3n[1], and the signal line ND3nO are common Thus, a configuration can be performed at once. Then, the determination circuit DET3n determines whether the configuration is performed under Condition 1 or Condition 2 at once.

In the PLD 300, the determination circuit 302 includes the determination circuits DET31 to DET3n. The determination circuit 302 may include n determination circuits DET.

On the other hand, the determination circuit 202 (FIG. 8 and FIG. 9) is considered.

In FIG. 6, to the wiring switches SW21-21 to SW2n-21, the signal line WL21[0] and the signal line WL21[1] are common. However, a signal from the signal line ND21O is input to the wiring switch SW21-21, a signal from the signal line ND22O is input to the wiring switch SW22-21, and a signal from the signal line ND2nO is input to the wiring switch SW2n-21.

The determination circuit DET21-21 determines whether the configuration in the wiring switch SW21-21 is performed under Condition 1 or Condition 2.

The determination circuit DET22-21 determines whether the configuration in the wiring switch SW22-21 is performed under Condition 1 or Condition 2.

The determination circuit DET2n-21 determines whether the configuration in the wiring switch SW2n-21 is performed under Condition 1 or Condition 2.

As described above, in the PLD 200, one determination circuit is needed for one wiring switch SW. Thus, when the number of the wiring switches SW is n×n, the n×n determination circuits 202 are needed.

Figure 21:
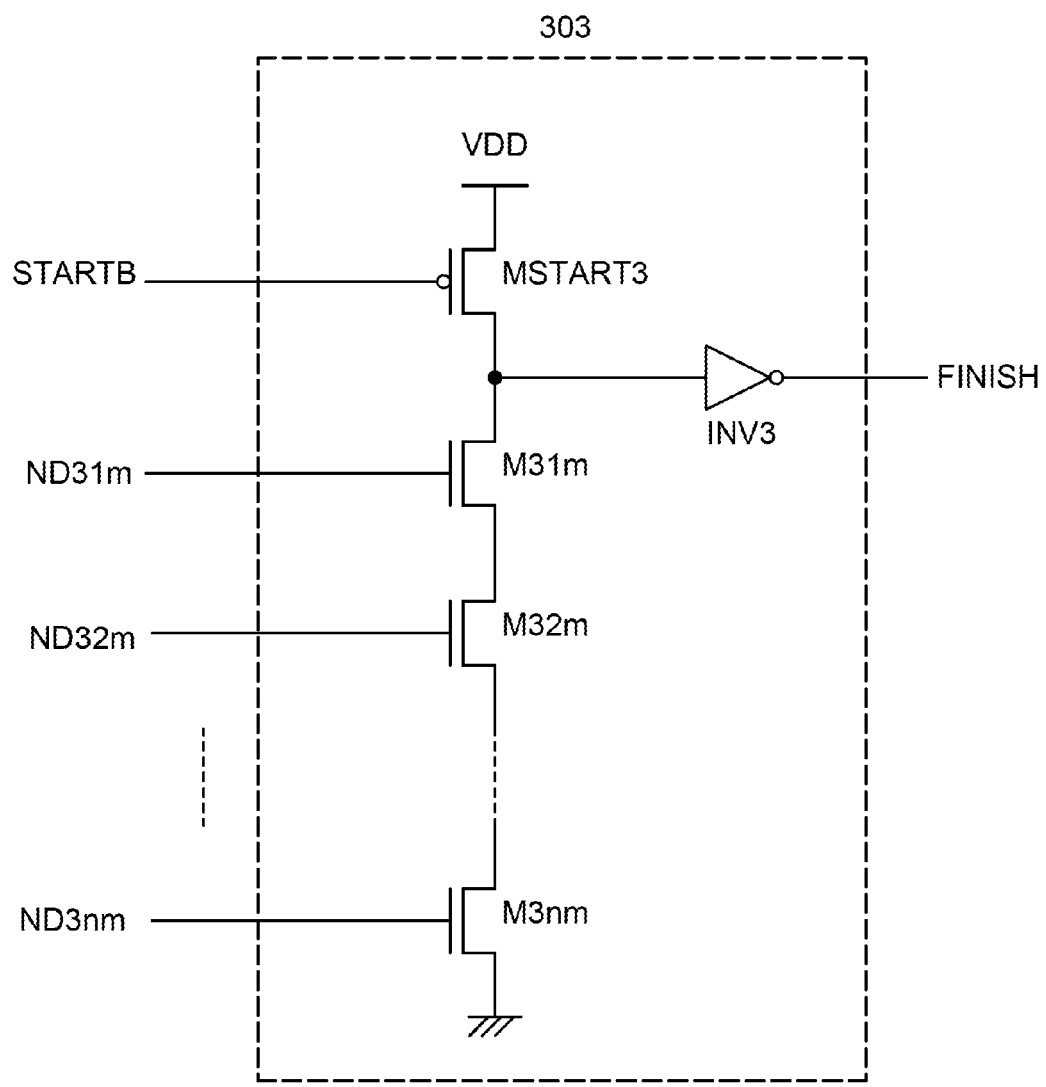
FIG. 21 shows a configuration example of an AND circuit.

FIG. 21 shows an example of a circuit diagram of the AND circuit 303.

The AND circuit 303 includes a transistor M31m and a transistor M32m to a transistor M3nm, a transistor MSTART3, and an inverter INV3. The AND circuit 303 has a function of outputting AND to an input.

The transistors M31m to M3nm and the transistor MSTART3 are connected in series.

A gate of the transistor MSTART3 is electrically connected to a signal line STARTB. One of a source and a drain of the transistor MSTART3 is electrically connected to a power line. Here, a voltage VDD is applied to the power line; however, the voltage is not necessarily VDD as long as a constant voltage is applied to the power line. The other of the source and the drain of the transistor MSTART3 is electrically connected to the inverter INV3.

A gate of the transistor M3nm is electrically connected to the signal line ND3nm. One of a source and a drain of the transistor M3nm is electrically connected to a power line. Here, a reference potential (GND) is applied to the power line; however, the voltage is not necessarily GND as long as a constant voltage is applied to the power line. The other of the source and the drain of the transistor M3nm is electrically connected to one of a source and a drain of a transistor M3(n-1)m (not illustrated).

A gate of the transistor M32m is electrically connected to the signal line ND32m. One of a source and a drain of the transistor M32m is electrically connected to one of a source and a drain of the transistor M33m (not illustrated). The other of the source and the drain of the transistor M32m is electrically connected to one of a source and a drain of the transistor M31m.

A gate of the transistor M31m is electrically connected to the signal line ND31m. The one of the source and the drain of the transistor M31m is electrically connected to the other of the source and the drain of the transistor M32m. The other of the source and the drain of the transistor M31m is electrically connected to the other of the source and the drain of the transistor MSTART3 and the inverter INV3.

The transistor MSTART3 has a function of resetting the signal line FINISH when a configuration is started.

To the signal line STARTB, an inversion signal of the signal line START is applied. Thus, a low-level voltage is applied to the signal line STARTB when a high-level voltage is applied to the signal line START and the signal line ND31m is reset.

When the voltage of the signal line STARTB is at a low level, the transistor MSTART3 is turned on. Since a high-level voltage (here, VDD) is applied to one of the source and the drain of the transistor MSTART3, a high-level voltage is applied to the inverter INV3. The inverter INV3 outputs a low-level voltage, and the low-level voltage is applied to the signal line FINISH. Then, a high-level voltage is applied to the signal line STARTB, and the transistor MSTART3 is turned off.

When the configuration under Condition 1 is performed on all of the wiring switches SW, a high-level voltage is stored in the signal lines ND31m to ND3nm. Accordingly, the transistors M31m to M3nm are turned on, and a low-level voltage (GND) is applied to the inverter INV3. The inverter INV3 outputs a high-level voltage. A high-level voltage is applied to the signal line FINISH.

The signal line FINISH is electrically connected to the word driver WD3 and the bit driver BD3 and transmits termination of the configuration (a high-level voltage) to the word driver WD3 and the bit driver BD3.

When the configuration under Condition 2 is performed on any of the wiring switches SW, a low-level voltage is stored in the signal lines ND31m to ND3nm. Accordingly, a high-level voltage (VDD) is applied to the inverter INV3; thus, the inverter INV3 outputs a low-level voltage. A low-level voltage is applied to the signal line FINISH.

The signal line FINISH transmits a signal indicating that the configuration has not been completed (a low-level voltage) to the word driver WD3 and the bit driver BD3.

The structure of the determination device 301 is not limited to that of this embodiment as long as the determination device 301 can determinate whether the configuration of the wiring switch SW is performed under Condition 1 or Condition 2.

Embodiment 5

Figure 12:
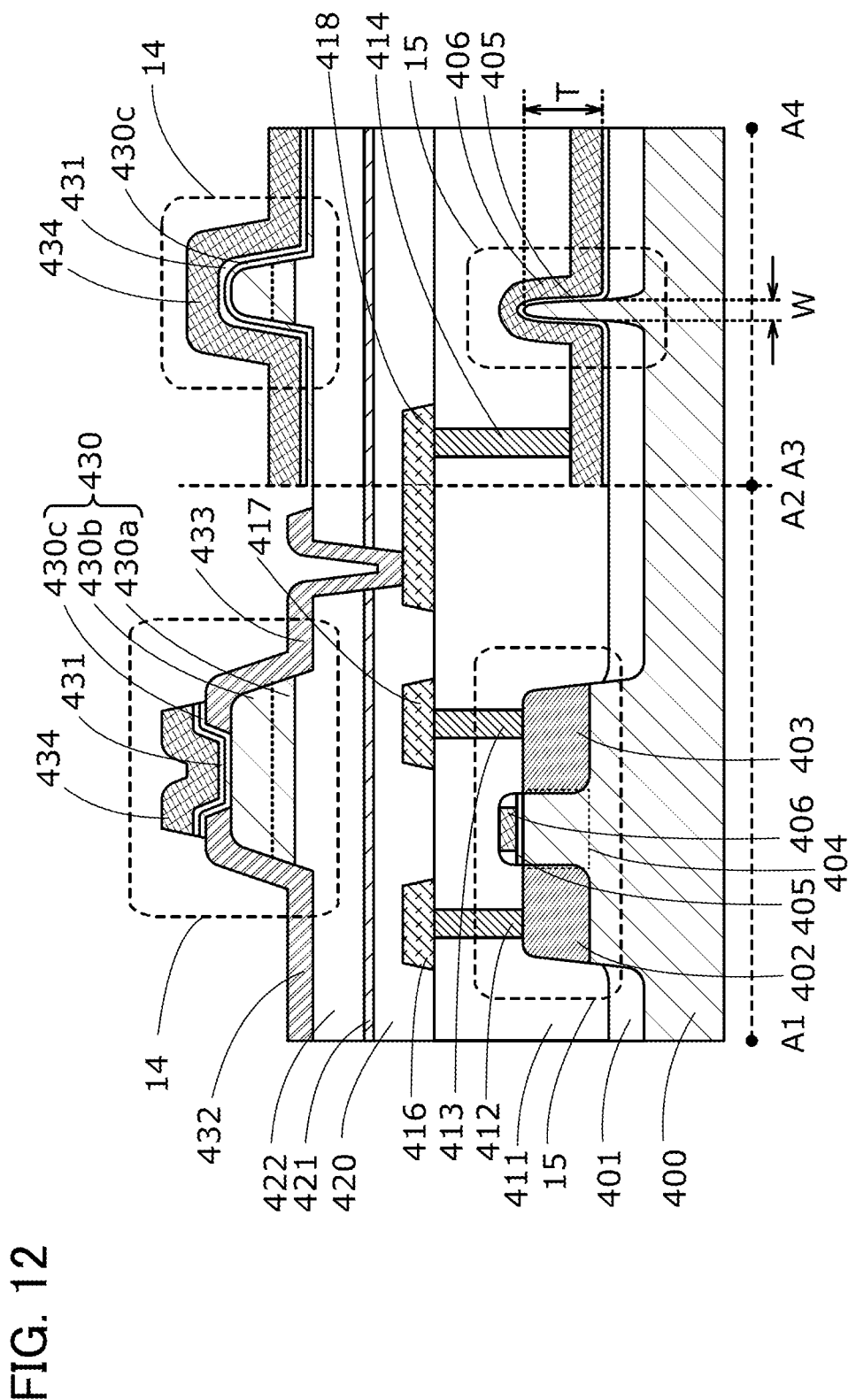
FIG. 12 illustrates a cross-sectional structure of a semiconductor device.

In this embodiment, the transistor 14 and the transistor 15 are described.
<Example of Cross-Sectional Structure of Semiconductor Device>
FIG. 12 illustrates a cross-sectional structure of a semiconductor device including the wiring switch 1 shown in FIG. 1 as an example. A region along dashed line A1-A2 shows a structure of the transistors 14 and 15 in the channel length direction, and a region along dashed line A3-A4 shows a structure of the transistors 14 and 15 in the channel width direction. In one embodiment of the present invention, the channel length direction of the transistor 14 is not necessarily aligned with the channel length direction of the transistor 15.

The channel length direction of a transistor denotes a direction in which carriers move between a source (source region or source electrode) and a drain (drain region or drain electrode). The channel width direction denotes a direction perpendicular to the channel length direction in a plane parallel to a substrate.

In FIG. 12, the transistor 14 including a channel formation region in an oxide semiconductor film is formed over the transistor 15 including a channel formation region in a single crystal silicon substrate.

The transistor 15 may include the channel formation region in a semiconductor film or a semiconductor substrate of silicon, germanium, or the like in an amorphous, microcrystalline, polycrystalline, or single crystal state. Alternatively, the transistor 15 may include the channel formation region in an oxide semiconductor film or an oxide semiconductor substrate. In the case where channel formation regions of all the transistors are included in an oxide semiconductor film or an oxide semiconductor substrate, the transistor 14 is not necessarily stacked over the transistor 15, and the transistors 14 and 15 may be formed in the same layer.

In the case where the transistor 15 is formed using a thin silicon film, any of the following can be used for the thin film: amorphous silicon formed by sputtering or vapor phase growth such as plasma CVD; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A substrate 400 where the transistor 15 is formed can be, for example, a silicon substrate, a germanium substrate, or a silicon germanium substrate. In FIG. 12, a single crystal silicon substrate is used as the substrate 400.

The transistor 15 is electrically isolated from other elements by an element isolation method. As the element isolation method, a trench isolation method (a shallow trench isolation (STI) method) or the like can be used. FIG. 12 illustrates an example where the trench isolation method is used to electrically isolate the transistor 15. Specifically, in FIG. 12, the transistor 15 is electrically isolated by element isolation using an element isolation region 401 formed in such a manner that an insulator including silicon oxide or the like is buried in a trench formed in the substrate 400 by etching or the like and then the insulator is removed partly by etching or the like.

In a projection of the substrate 400 that exists in a region other than the trench, an impurity region 402 and an impurity region 403 of the transistor 15 and a channel formation region 404 placed between the impurity regions 402 and 403 are provided. Furthermore, the transistor 15 includes an insulating film 405 covering the channel formation region 404, and a gate electrode 406 that overlaps with the channel formation region 404 with the insulating film 405 provided therebetween.

In the transistor 15, a side portion and an upper portion of the projection in the channel formation region 404 overlap with the gate electrode 406 with the insulating film 405 positioned therebetween, so that carriers flow in a wide area (including the side portion and the upper portion of the channel formation region 404). Thus, the number of transferred carriers in the transistor 15 can be increased while an area over the substrate occupied by the transistor 15 is reduced. As a result, the on-state current of the transistor 15 is increased and the field-effect mobility of the transistor 15 is increased.

Suppose the length in the channel width direction (channel width) of the projection in the channel formation region 404 is W, and the thickness of the projection in the channel formation region 404 is T. When the aspect ratio of the thickness T to the channel width W is high, a region where carriers flow becomes larger. Thus, the on-state current of the transistor 15 can be further increased and the field-effect mobility of the transistor 15 can be further increased.

Note that in the case of the transistor 15 formed using a bulk semiconductor substrate, the aspect ratio is preferably 0.5 or higher, more preferably 1 or higher.

An insulating film 411 is provided over the transistor 15. Openings are formed in the insulating film 411. Conductive films 412 and 413 that are electrically connected to the impurity regions 402 and 403, respectively, and a conductive film 414 that is electrically connected to the gate electrode 406 are formed in the openings.

The conductive film 412 is electrically connected to a conductive film 416 formed over the insulating film 411. The conductive film 413 is electrically connected to a conductive film 417 formed over the insulating film 411. The conductive film 414 is electrically connected to a conductive film 418 formed over the insulating film 411.

An insulating film 420 is provided over the conductive films 416 to 418. An insulating film 421 having a blocking effect of preventing diffusion of oxygen, hydrogen, and water is provided over the insulating film 420. As the insulating film 421 has higher density and becomes denser or has a fewer dangling bonds and becomes more chemically stable, the insulating film 421 has a higher blocking effect. The insulating film 421 that has the effect of blocking diffusion of oxygen, hydrogen, and water can be formed of, for example, aluminum oxide, aluminum oxynitride, gallium oxide, gallium oxynitride, yttrium oxide, yttrium oxynitride, hafnium oxide, or hafnium oxynitride. The insulating film 421 having an effect of blocking diffusion of hydrogen and water can be formed of, for example, silicon nitride or silicon nitride oxide.

An insulating film 422 is provided over the insulating film 421, and the transistor 14 is provided over the insulating film 422.

The transistor 14 includes, over the insulating film 422, a semiconductor film 430 containing an oxide semiconductor, conductive films 432 and 433 that are electrically connected to the semiconductor film 430 and function as source and drain electrodes, a gate insulating film 431 covering the semiconductor film 430, and a gate electrode 434 that overlaps the semiconductor film 430 with the gate insulating film 431 positioned therebetween. Note that an opening is formed in the insulating films 420 to 422. The conductive film 433 is connected to the conductive film 418 in the opening.

Note that in FIG. 12, the transistor 14 includes at least the gate electrode 434 on one side of the semiconductor film 430, and may further include a gate electrode overlapping with the semiconductor film 430 with the insulating film 422 positioned therebetween.

In the case where the transistor 14 has a pair of gate electrodes, one of the gate electrodes may be supplied with a signal for controlling the on/off state, and the other of the gate electrodes may be supplied with a potential from another element. In this case, potentials at the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 12, the transistor 14 has a single-gate structure where one channel formation region corresponding to one gate electrode 434 is provided. However, the transistor 14 may have a multi-gate structure in which a plurality of electrically connected gate electrodes is provided so that a plurality of channel formation regions is included in one active layer.

FIG. 12 illustrates an example in which the semiconductor film 430 included in the transistor 14 includes oxide semiconductor films 430a to 430c that are stacked in this order over the insulating film 422. Note that in one embodiment of the present invention, the semiconductor film 430 of the transistor 14 may be formed using a single-layer metal oxide film.

<Transistor>

Next, the description is made on a structural example of a transistor 90 having a channel formation region in an oxide semiconductor film.

Figure 13A:
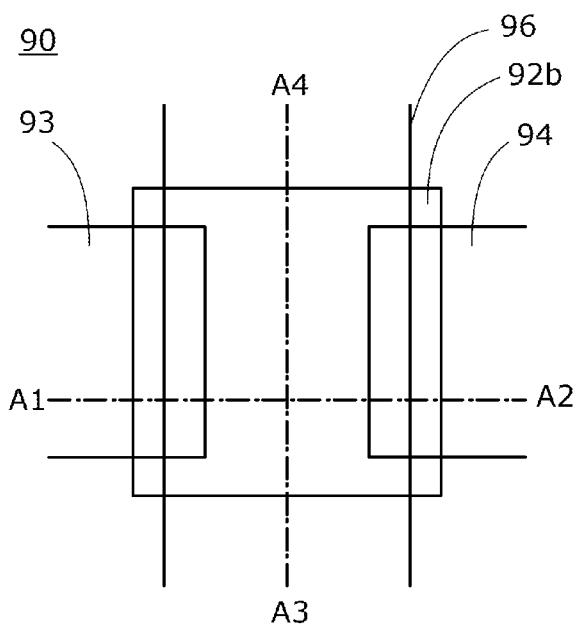
FIGS. 13A to 13C illustrate a structure of a transistor.
Figure 13C:
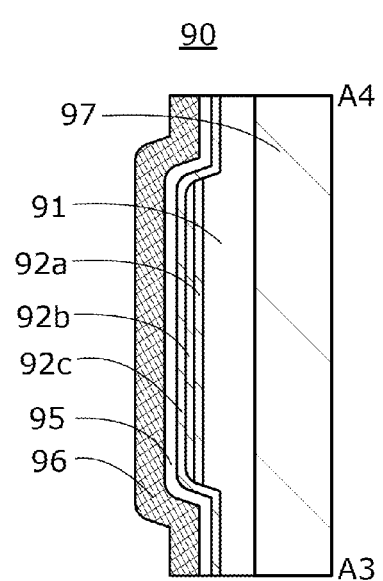
Figure 13B:
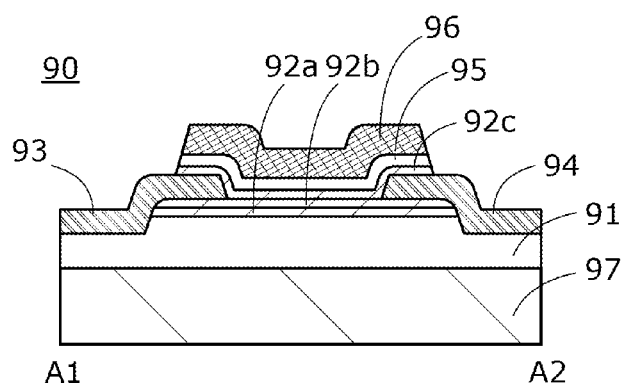

FIGS. 13A to 13C illustrate a structure example of the transistor 90 having a channel formation region in an oxide semiconductor film. FIG. 13A is the top view of the transistor 90. Note that insulating films are not illustrated in FIG. 13A in order to clarify the layout of the transistor 90. FIG. 13B is a cross-sectional view along the dashed line A1-A2 in the top view in FIG. 13A. FIG. 13C is a cross-sectional view along the dashed line A3-A4 in the top view in FIG. 13A.

As illustrated in FIG. 13A to 13C, the transistor 90 includes an oxide semiconductor film 92a and an oxide semiconductor film 92b that are stacked in this order over an insulating film 91 formed over a substrate 97; a conductive film 93 and a conductive film 94 that are electrically connected to the oxide semiconductor film 92b and function as a source electrode and a drain electrode; an oxide semiconductor film 92c over the oxide semiconductor film 92b, the conductive film 93, and the conductive film 94; an insulating film 95 that functions as a gate insulating film and is located over the oxide semiconductor film 92c; and a conductive film 96 that functions as a gate electrode, lies over the insulating film 95, and overlaps with the oxide semiconductor films 92a to 92c. Note that the substrate 97 may be a glass substrate, a semiconductor substrate, or the like or may be an element substrate where semiconductor elements are formed over a glass substrate or on a semiconductor substrate.

Figure 14A:
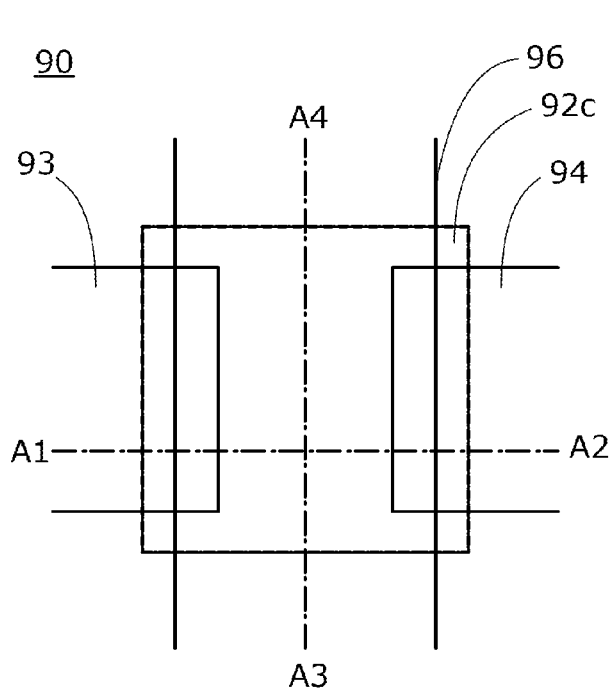
FIGS. 14A to 14C illustrate a structure of a transistor.
Figure 14C:
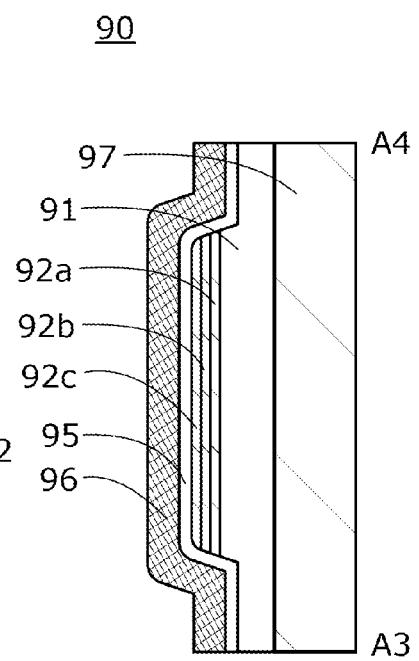
Figure 14B:
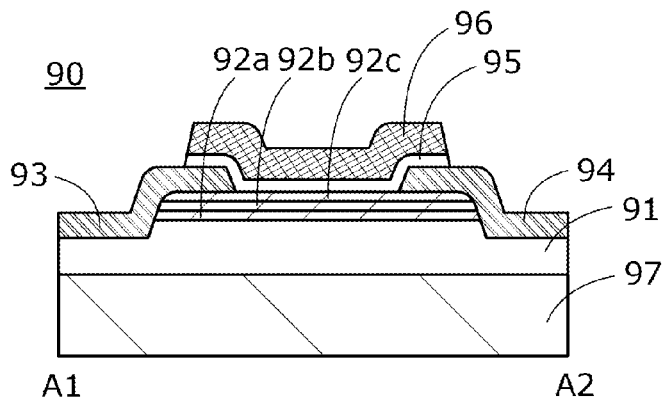

FIGS. 14A to 14C illustrates another specific example of the structure of the transistor 90. FIG. 14A is the top view of the transistor 90. Note that insulating films are not illustrated in FIG. 14A in order to clarify the layout of the transistor 90. FIG. 14B is a cross-sectional view along the dashed line A1-A2 in the top view in FIG. 14A. FIG. 14C is a cross-sectional view along the dashed line A3-A4 in the top view in FIG. 14A.

As illustrated in FIGS. 14A to 14C, the transistor 90 includes the oxide semiconductor films 92a to 92c that are stacked in this order over the insulating film 91; the conductive films 93 and 94 that are electrically connected to the oxide semiconductor film 92c and function as a source electrode and a drain electrode; the insulating film 95 that functions as a gate insulating film and is located over the oxide semiconductor film 92c and the conductive films 93 and 94; and the conductive film 96 that functions as a gate electrode, lies over the insulating film 95, and overlaps with the oxide semiconductor films 92a to 92c.

FIGS. 13A to 13C and FIGS. 14A to 14C each illustrate the structure example of the transistor 90 in which the oxide semiconductor films 92a to 92c are stacked. However, the structure of the oxide semiconductor film included in the transistor 90 is not limited to a stacked-layer structure including a plurality of oxide semiconductor films and may be a single-layer structure.

In the case where the transistor 90 includes the semiconductor film in which the semiconductor films 92a to 92c are stacked in this order, each of the oxide semiconductor films 92a and 92c is an oxide semiconductor film that contains at least one of metal elements contained in the oxide semiconductor film 92b and in which energy at the conduction band minimum is closer to the vacuum level than that in the oxide semiconductor film 92b is by higher than or equal to 0.05 eV, 0.07 eV, 0.1 eV, or 0.15 eV and lower than or equal to 2 eV, 1 eV, 0.5 eV, or 0.4 eV. The oxide semiconductor film 92b preferably contains at least indium because carrier mobility is increased.

In the case where the transistor 90 includes the semiconductor films with the above structure, when an electric field is applied to the semiconductor films by applying voltage to the gate electrode, a channel region is formed in the oxide semiconductor film 92b, which has the lowest conduction band minimum among the semiconductor films. That is, since the oxide semiconductor film 92c is provided between the oxide semiconductor film 92b and the insulating film 95, a channel region can be formed in the oxide semiconductor film 92b, which is separated from the insulating film 95.

Since the oxide semiconductor film 92c contains at least one of metal elements contained in the oxide semiconductor film 92b, interface scattering is unlikely to occur at the interface between the oxide semiconductor film 92b and the oxide semiconductor film 92c. Thus, the movement of carriers is unlikely to be inhibited at the interface, which results in an increase in the field-effect mobility of the transistor 90.

When an interface state is formed at an interface between the oxide semiconductor films 92b and 92a, a channel region is also formed in a region close to the interface; thus, the threshold voltage of the transistor 90 varies. However, since the oxide semiconductor film 92a contains at least one of metal elements contained in the oxide semiconductor film 92b, an interface state is unlikely to be formed at the interface between the oxide semiconductor film 92b and the oxide semiconductor film 92a. Accordingly, the above structure allows reducing of variations in the electrical characteristics of the transistor 90, such as the threshold voltage.

Further, it is preferable that a plurality of oxide semiconductor films be stacked so that an interface state due to an impurity existing between the oxide semiconductor films, which inhibits carrier flow, is not formed at an interface between the oxide semiconductor films. This is because when an impurity exists between the stacked oxide semiconductor films, the continuity of the energies of the conduction band minima of the oxide semiconductor films is lost, and carriers are trapped or disappear by recombination in the vicinity of the interface. By reducing an impurity existing between the films, a continuous junction (here, in particular, a well structure having a U shape in which energies of the conduction band minima are changed continuously between the films) is formed easily as compared with the case of merely stacking the plurality of oxide semiconductor films which contain at least one common metal as a main component.

In order to form such a continuous junction, it is necessary to form films continuously without being exposed to air, with use of a multi-chamber deposition apparatus (sputtering apparatus) including a load lock chamber. Each chamber of the sputtering apparatus is preferably evacuated to a high vacuum (to about $5\times10^7$ Pa to $1\times10^{-4}$ Pa) by an adsorption vacuum pump such as a cryopump so that water and the like acting as impurities for the oxide semiconductor are removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the above gas has a dew point of −40° C. or lower, preferably −80° C. or lower, further preferably −100° C. or lower and is highly purified, moisture and the like can be prevented from entering the oxide semiconductor film as much as possible. Specifically, in the case where the oxide semiconductor film 92b is an In—M—Zn oxide film (M represents Ga, Y, Zr, La, Ce, or Nd) and a target having the atomic ratio of metal elements of In:M:Zn=$x_1$:$y_1$:$z_1$ is used for forming the oxide semiconductor film 92b, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a c-axis aligned crystalline oxide semiconductor (CAAC-OS) film as the oxide semiconductor film 92b is easily formed. Typical examples of the atomic ratio of the metal elements of the target are In:M:Zn=1:1:1, In:M:Zn=3:1:2, and the like.

Specifically, in the case where the oxide semiconductor film 92a and the oxide semiconductor film 92c are an In—M—Zn oxide film (M represents Ga, Y, Zr, La, Ce, or Nd) and a target having the atomic ratio of metal elements of In:M:Zn=$x_2$:$y_2$:$z_2$ is used for forming the oxide semiconductor films 92a and 92c, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, CAAC-OS films are easily formed as the oxide semiconductor films 92a and 92c. Typical examples of the atomic ratio of the metal elements of the target are In:M:Zn=1:3:2, In:M:Zn=1:3:4, In:M:Zn=1:3:6, In:M:Zn=1:3:8, and the like.

The oxide semiconductor film 92a and the oxide semiconductor film 92c each have a thickness of more than or equal to 3 nm and less than or equal to 100 nm, preferably more than or equal to 3 nm and less than or equal to 50 nm. The thickness of the oxide semiconductor film 92b is more than or equal to 3 nm and less than or equal to 200 nm, preferably more than or equal to 3 nm and less than or equal to 100 nm, further preferably more than or equal to 3 nm and less than or equal to 50 nm.

In the three-layer semiconductor film, the three oxide semiconductor films 92a to 92c can be either amorphous or crystalline. Note that the oxide semiconductor film 92b in which a channel region is formed preferably has a crystalline structure, so that the transistor 90 can have stable electrical characteristics.

Note that a channel formation region refers to a region of a semiconductor film of the transistor 90 that overlaps with a gate electrode and is located between a source electrode and a drain electrode. Furthermore, a channel region refers to a region through which current mainly flows in the channel formation region.

For example, when an In—Ga—Zn oxide film formed by a sputtering method is used as each of the oxide semiconductor films 92a and 92c, the oxide semiconductor films 92a and 92c can be deposited with the use of an In—Ga—Zn oxide target having an atomic ratio of In:Ga:Zn=1:3:2. The deposition conditions can be as follows: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Furthermore, when the oxide semiconductor film 92*b* is a CAAC-OS film, the oxide semiconductor film 92*b* is preferably deposited with the use of a polycrystalline In—Ga—Zn oxide target having an atomic ratio of In:Ga:Zn=1:1:1. The deposition conditions can be as follows: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

Although the oxide semiconductor films 92*a* to 92*c* can be formed by a sputtering method, they may be formed by another method, e.g., a thermal CVD method. A metal organic chemical vapor deposition (MOCVD) method or an atomic layer deposition (ALD) method may be given as an example of the thermal CVD method.

There are few carrier generation sources in a highly purified oxide semiconductor obtained by reduction of impurities such as moisture and hydrogen serving as electron donors (donors) and reduction of oxygen vacancies; therefore, the highly purified oxide semiconductor can be an intrinsic (i-type) semiconductor or a substantially i-type semiconductor. For this reason, a transistor having a channel formation region in a highly purified oxide semiconductor film has extremely small off-state current and high reliability. Thus, a transistor in which a channel formation region is formed in the oxide semiconductor film easily has an electrical characteristic of a positive threshold voltage (also referred to as a normally-off characteristic).

Specifically, various experiments can prove a small off-state current of a transistor having a channel formation region in a highly purified oxide semiconductor. For example, even when an element has a channel width of $1 \times 10^6$ μm and a channel length of 10 μm, off-state current can be less than or equal to the measurement limit of a semiconductor parameter analyzer, i.e., less than or equal to $1 \times 10^{-13}$ A, at voltage (drain voltage) between the source electrode and the drain electrode of from 1 V to 10 V. In that case, it can be seen that off-state current standardized on the channel width of the transistor is lower than or equal to 100 zA/μm. In addition, a capacitor and a transistor are connected to each other and the off-state current is measured with a circuit in which charge flowing into or from the capacitor is controlled by the transistor. In the measurement, a highly purified oxide semiconductor film was used for a channel formation region of the transistor, and the off-state current of the transistor was measured from a change in the amount of electrical charge of the capacitor per unit hour. As a result, it was found that, in the case where the voltage between the source electrode and the drain electrode of the transistor is 3 V, a lower off-state current of several tens of yA/μm is obtained. Accordingly, the off-state current of the transistor in which the highly purified oxide semiconductor film is used as a channel formation region is considerably lower than that of a transistor in which silicon having crystallinity is used.

In the case where an oxide semiconductor film is used as the semiconductor film, at least indium (In) or zinc (Zn) is preferably included in an oxide semiconductor. The oxide semiconductor preferably contains, in addition to In and Zn, gallium (Ga) serving as a stabilizer that reduces variations in electric characteristics of the transistor using the above-described oxide semiconductor film. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

An In—Ga—Zn oxide and an In—Sn—Zn oxide among oxide semiconductors have the following advantages over silicon carbide, gallium nitride, and gallium oxide: transistors with excellent electrical characteristics can be formed by a sputtering method or a wet process and thus can be mass-produced easily. Further, unlike silicon carbide, gallium nitride, or gallium oxide, with the use of the In—Ga—Zn oxide, a transistor with favorable electrical characteristics can be formed over a glass substrate. Furthermore, a larger substrate can be used.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, any of the following oxides can be used, for example: indium oxide, gallium oxide, tin oxide, zinc oxide, an In—Zn oxide, an Sn—Zn oxide, an Al—Zn oxide, a Zn—Mg oxide, an Sn—Mg oxide, an In—Mg oxide, an In—Ga oxide, an In—Ga—Zn oxide (also referred to as IGZO), an In—Al—Zn oxide, an In—Sn—Zn oxide, an Sn—Ga—Zn oxide, an Al—Ga—Zn oxide, an Sn—Al—Zn oxide, an In—Hf—Zn oxide, an In—La—Zn oxide, an In—Pr—Zn oxide, an In—Nd—Zn oxide, an In—Ce—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide refers to an oxide containing In, Ga, and Zn, and there is no limitation on the ratio between In, Ga, and Zn. Further, the In—Ga—Zn oxide may contain a metal element other than In, Ga, and Zn. The In—Ga—Zn oxide has sufficiently high resistance when no electric field is applied thereto, so that off-state current can be sufficiently reduced. Moreover, the In—Ga—Zn oxide has high mobility.

For example, high mobility can be obtained relatively easily in the case of using an In—Sn—Zn oxide. Meanwhile, when an In—Ga—Zn oxide is used, the mobility can be increased by reduction in the defect density in a bulk.

Furthermore, in the transistor 90, a metal in the source electrode and the drain electrode might extract oxygen from the oxide semiconductor film depending on a conductive material used for the source electrode and the drain electrode. In such a case, a region of the oxide semiconductor film in contact with the source electrode or the drain electrode becomes an n-type region due to the formation of an oxygen vacancy. The n-type region serves as a source region or a drain region, resulting in a decrease in the contact resistance between the oxide semiconductor film and the source electrode or the drain electrode. Accordingly, the formation of the n-type region increases the mobility and on-state current of the transistor 90, achieving the high-speed operation of a semiconductor device using the transistor 90.

Note that the extraction of oxygen by a metal in the source electrode and the drain electrode is probably caused when the source electrode and the drain electrode are formed by a sputtering method or when heat treatment is performed after the formation of the source electrode and the drain electrode. The n-type region is more likely to be formed by forming the source electrode and the drain electrode with use of a conductive material which is easily bonded to oxygen. Examples of such a conductive material include Al, Cr, Cu, Ta, Ti, Mo, and W.

Furthermore, in the case where the semiconductor film including the stacked oxide semiconductor films is used in the transistor 90, the n-type region preferably extends to the oxide semiconductor film 92b serving as a channel region in order that the mobility and on-state current of the transistor 90 can be further increased and the semiconductor device can operate at higher speed.

The insulating film 91 preferably has a function of supplying part of oxygen to the oxide semiconductor films 92a to 92c by heating. It is preferable that the number of defects in the insulating film 91 be small, and typically the spin density of g=2.001 due to a dangling bond of silicon be lower than or equal to $1 \times 10^{18}$ spins/cm$^3$. The spin density is measured by electron spin resonance (ESR) spectroscopy.

The insulating film 91, which has a function of supplying part of oxygen to the oxide semiconductor films 92a to 92c by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 91 can be formed by a plasma CVD (chemical vapor deposition) method, a sputtering method, or the like.

Note that in this specification, oxynitride contains more oxygen than nitrogen, and nitride oxide contains more nitrogen than oxygen.

Note that in the transistor 90 illustrated in FIGS. 13A to 13C and FIGS. 14A to 14C, the conductive film 96 overlaps with end portions of the oxide semiconductor film 92b including a channel region that do not overlap with the conductive films 93 and 94, i.e., end portions of the oxide semiconductor film 92b that are in a region different from a region where the conductive films 93 and 94 are located. When the end portions of the oxide semiconductor film 92b are exposed to plasma by etching for forming the end portions, a chlorine radical, a fluorine radical, or other radicals generated from an etching gas are easily bonded to a metal element contained in the oxide semiconductor. For this reason, in the end portion of the oxide semiconductor film, oxygen bonded to the metal element is easily eliminated, so that an oxygen vacancy is easily formed; thus, the oxide semiconductor film easily has n-type conductivity. However, an electric field applied to the end portions can be controlled by controlling the potential of the conductive film 96 because the end portions of the oxide semiconductor film 92b that do not overlap with the conductive films 93 and 94 overlap with the conductive film 96 in the transistor 90 illustrated in FIGS. 13A to 13C and FIGS. 14A to 14C. Consequently, current that flows between the conductive films 93 and 94 through the end portions of the oxide semiconductor film 92b can be controlled by the potential applied to the conductive film 96. Such a transistor structure is referred to as a surrounded channel (s-channel) structure.

With the s-channel structure, specifically, when a potential at which the transistor 90 is turned off is supplied to the conductive film 96, the amount of off-state current that flows between the conductive films 93 and 94 through the end portions can be reduced. For this reason, in the transistor 90, even when the distance between the conductive films 93 and 94 at the end portions of the oxide semiconductor film 92b is reduced as a result of reducing the channel length to obtain high on-state current, the transistor 90 can have low off-state current. Consequently, with the short channel length, the transistor 90 can have high on-state current when in an on state and low off-state current when in an off state.

With the s-channel structure, specifically, when a potential at which the transistor 90 is turned on is supplied to the conductive film 96, the amount of current that flows between the conductive films 93 and 94 through the end portions can be increased. The current contributes to an increase in the field-effect mobility and the on-state current of the transistor 90. When the end portions of the oxide semiconductor film 92b overlap with the conductive film 96, carriers flow in a wide region of the oxide semiconductor film 92b without being limited to a region in the vicinity of the interface of the oxide semiconductor film 92b close to the insulating film 95, which results in an increase in the amount of carrier movement in the transistor 90. As a result, the on-state current of the transistor 90 is increased, and the field-effect mobility is increased to greater than or equal to 10 cm$^2$/V·s or to greater than or equal to 20 cm$^2$/V·s, for example. Note that here, the field-effect mobility is not an approximate value of the mobility as the physical property of the oxide semiconductor film but is an index of current drive capability and the apparent field-effect mobility of a saturation region of the transistor.

A structure of the oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflecting a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appears at around 31° and a peak of 2θ does not appear at around 36°.

In a transistor including the CAAC-OS film, a change in electrical characteristics due to irradiation with visible light or ultraviolet light is small. Thus, the transistor has high reliability.

Note that an oxide semiconductor film may be a stacked film including two or more kinds of an amorphous oxide semiconductor film, a microcrystalline oxide semiconductor film, and a CAAC-OS film, for example.

For the deposition of the CAAC-OS film, the following conditions are preferably used.

By reducing the amount of impurities entering the CAAC-OS layer during the deposition, the crystal state can be prevented from being broken by the impurities. For example, the concentration of impurities (e.g., hydrogen, water, carbon dioxide, and nitrogen) which exist in the treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like (pellet-like) sputtered particles reach the substrate, migration occurs on the substrate, so that a flat plane of each flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

As an example of the target, an In—Ga—Zn oxide target is described below.

The In—Ga—Zn oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder, $GaO_Y$ powder, and $ZnO_Z$ powder is, for example, 2:2:1, 8:4:3, 3:1:1, 1:1:1, 4:2:3, 2:1:3, or 3:1:2. The kinds of powder and the molar ratio for mixing powder may be determined as appropriate depending on the desired target. In particular, when a CAAC-OS film is formed using a target with a molar ratio of In:Ga:Zn=2:1:3, a proportion of a region where a diffraction pattern of CAAC-OS is observed in a certain area (proportion of CAAC) can be increased. Therefore, frequency characteristics (f characteristics) can be improved.

An alkali metal is not an element included in an oxide semiconductor and thus is an impurity. Also, alkaline earth metal is an impurity in the case where the alkaline earth metal is not a component of the oxide semiconductor. Alkali metal, in particular, Na becomes $Na^+$ when an insulating film in contact with the oxide semiconductor film is an oxide and Na diffuses into the insulating film. Further, in the oxide semiconductor film, Na cuts or enters a bond between metal and oxygen which are included in the oxide semiconductor. As a result, for example, degradation of electrical characteristics of a transistor, such as a normally-on state of the transistor due to shift of the threshold voltage in the negative direction or reduction in mobility, occurs. In addition, variations in electrical characteristics also occurs. Specifically, the Na concentration according to secondary ion mass spectrometry is reduced to preferably less than or equal to $5\times10^{16}/cm^3$, further preferably less than or equal to $1\times10^{16}/cm^3$, still further preferably less than or equal to $1\times10^{15}/cm^3$. In a similar manner, the measurement value of Li concentration is preferably less than or equal to $5\times10^{15}/cm^3$, more preferably less than or equal to $1\times10^{15}/cm^3$. In a similar manner, the measurement value of K concentration is preferably less than or equal to $5\times10^{15}/cm^3$, more preferably less than or equal to $1\times10^{15}/cm^3$.

In the case where a metal oxide containing indium is used, silicon or carbon having higher bond energy with oxygen than indium might cut the bond between indium and oxygen, so that an oxygen vacancy is formed. Accordingly, when silicon or carbon is contained in the oxide semiconductor film, the electric characteristics of the transistor are likely to deteriorate as in the case of an alkali metal or an alkaline earth metal. Thus, the concentration of silicon and the concentration of carbon in the oxide semiconductor film are preferably low. Specifically, the C concentration or the Si concentration measured by secondary ion mass spectrometry is preferably less than or equal to $1\times10^{18}/cm^3$. In this case, the deterioration of the electric characteristics of the transistor can be prevented, so that the reliability of a semiconductor device can be improved.

<Example of Cross-Sectional Structure of Semiconductor Device>

Figure 15:
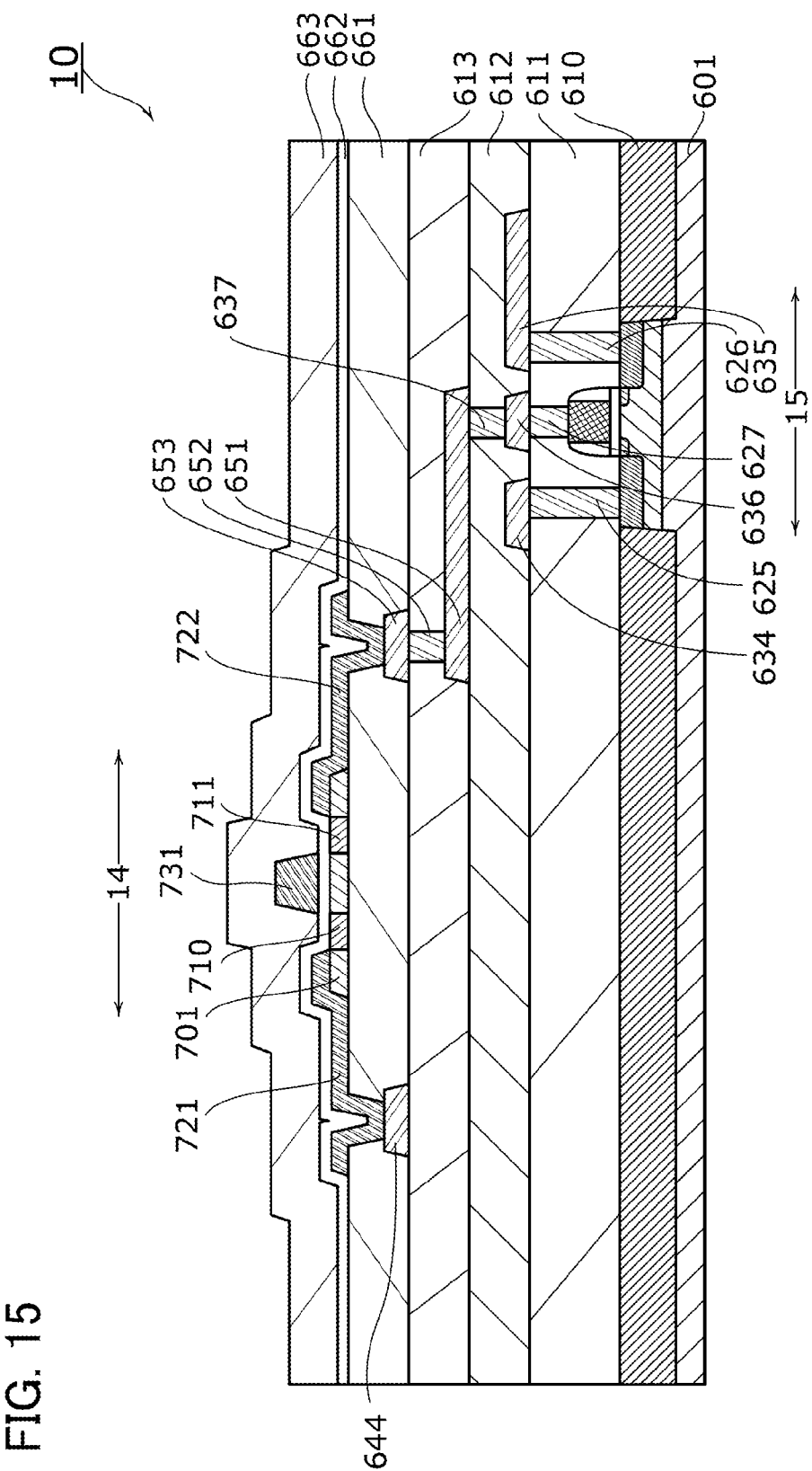
FIG. 15 illustrates a cross-sectional structure of a semiconductor device.

FIG. 15 illustrates a cross-sectional structure of a semiconductor device 10 including the wiring switch 1 shown in FIG. 1 as an example.

In FIG. 15, the transistor 14 including a channel formation region in an oxide semiconductor film is formed over the transistor 15 including a channel formation region in a single crystal silicon substrate.

The transistor 15 may include the channel formation region in a semiconductor film or a semiconductor substrate of silicon, germanium, or the like in an amorphous, microcrystalline, polycrystalline, or single crystal state. Alternatively, the transistor 15 may include the channel formation region in an oxide semiconductor film or an oxide semiconductor substrate. In the case where channel formation regions of all the transistors are included in an oxide semiconductor film or an oxide semiconductor substrate, the transistor 14 is not necessarily stacked over the transistor 15, and the transistors 14 and 15 may be formed in the same layer.

In the case where the transistor 15 is formed using a thin silicon film, any of the following can be used for the thin film: amorphous silicon formed by sputtering or vapor phase growth such as plasma CVD; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A semiconductor substrate 601 where the transistor 15 is formed can be, for example, a silicon substrate, a germanium substrate, or a silicon germanium substrate. In FIG. 15, a single crystal silicon substrate is used as the semiconductor substrate 601.

The transistor 15 is electrically isolated from other elements by an element isolation method. As the element isolation method, a local oxidation of silicon (LOCOS) method, a shallow trench isolation (STI) method, or the like can be employed. In FIG. 15, the transistor 15 is electrically isolated by trench isolation. Specifically, in FIG. 15, the transistor 15 is electrically isolated by element isolation using an element isolation region 610 formed in such a manner that an insulator including silicon oxide or the like is buried in a trench formed in the semiconductor substrate 601 by etching or the like.

An insulating film 611 is provided over the transistor 15. Openings are formed in the insulating film 611. Conductive films 625 and 626 that are electrically connected to the source and drain of the transistor 15 and a conductive film 627 that is electrically connected to the gate of the transistor 15 are formed in the openings.

The conductive film 625 is electrically connected to a conductive film 634 formed over the insulating film 611. The conductive film 626 is electrically connected to a conductive film 635 formed over the insulating film 611. The conductive film 627 is electrically connected to a conductive film 636 formed over the insulating film 611.

An insulating film 612 is formed over the conductive films 634 and 635. An opening is formed in the insulating film 612. A conductive film 637 electrically connected to the conductive film 636 is formed in the opening. The conductive film 637 is electrically connected to a conductive film 651 formed over the insulating film 612.

An insulating film 613 is formed over the conductive film 651. An opening is formed in the insulating film 613. A conductive film 652 electrically connected to the conductive film 651 is formed in the opening. The conductive film 652 is electrically connected to a conductive film 653 formed over the insulating film 613. A conductive film 644 is formed over the insulating film 613.

An insulating film 661 is formed over the conductive film 653 and the conductive film 644. In FIG. 15, the transistor 14 is formed over the insulating film 661.

The transistor 14 includes, over the insulating film 661, a semiconductor film 701 including an oxide semiconductor, conductive films 721 and 722 functioning as source and drain electrodes over the semiconductor film 701, a gate insulating film 662 over the semiconductor film 701 and the conductive films 721 and 722, and a gate electrode 731 overlapping with the semiconductor film 701 over the gate insulating film 662 and between the conductive films 721 and 722. Note that the conductive film 722 is electrically connected to the conductive film 653 in the opening formed in the insulating film 661.

In the semiconductor film 701 of the transistor 14, there is a region 710 between a region overlapping with the conductive film 721 and a region overlapping with the gate electrode 731. In addition, in the semiconductor film 701 of the transistor 14, there is a region 711 between a region overlapping with the conductive film 722 and the region overlapping with the gate electrode 731. When rare gas such as argon, an impurity which imparts p-type conductivity to the semiconductor film 701, or an impurity which imparts n-type conductivity to the semiconductor film 701 is added to the regions 710 and 711 using the conductive films 721 and 722 and the gate electrode 731 as a mask, the resistivity of the regions 710 and 711 can be made lower than that of the region overlapping with the gate electrode 731 in the semiconductor film 701.

An insulating film 663 is provided over the transistor 14.

In FIG. 15, the transistor 14 has the gate electrode 731 on at least one side of the semiconductor film 701; alternatively, the transistor 14 may have a pair of gate electrodes with the semiconductor film 701 positioned therebetween.

In the case where the transistor 14 has a pair of gate electrodes with the semiconductor film 701 positioned therebetween, one of the gate electrodes may be supplied with a signal for controlling the on/off state, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 15, the transistor 14 has a single-gate structure where one channel formation region corresponding to one gate electrode 731 is provided. However, the transistor 14 may have a multi-gate structure in which a plurality of electrically connected gate electrodes is provided so that a plurality of channel formation regions is included in one active layer.

Embodiment 6

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are cellular phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and medical devices. FIGS. 16A to 16F illustrate specific examples of these electronic devices.

Figure 16A:
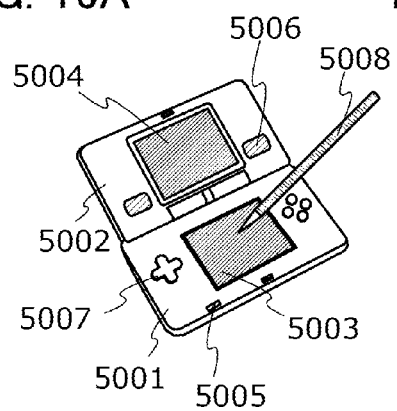
FIGS. 16A to 16F illustrate electronic devices.

FIG. 16A illustrates a portable game machine which includes a housing 5001, a housing 5002, a display portion 5003, a display portion 5004, a microphone 5005, a speaker 5006, an operation key 5007, a stylus 5008, and the like. The semiconductor device of one embodiment of the present invention can be used for a variety of integrated circuits included in portable game machines. Although the portable game machine in FIG. 16A has the two display portions 5003 and 5004, the number of display portions included in a portable game machine is not limited to this.

Figure 16B:
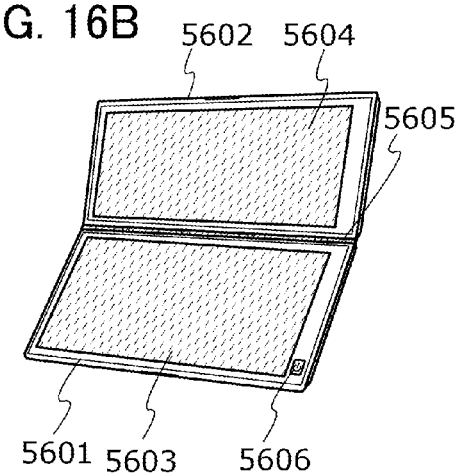

FIG. 16B illustrates a portable information terminal which includes a first housing 5601, a second housing 5602, a first display portion 5603, a second display portion 5604, a joint 5605, an operation key 5606, and the like. The semiconductor device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by providing a touch panel in a display device. Alternatively, the position input function can be added by provision of a photoelectric conversion element called a photosensor in a pixel portion of a display device.

Figure 16C:
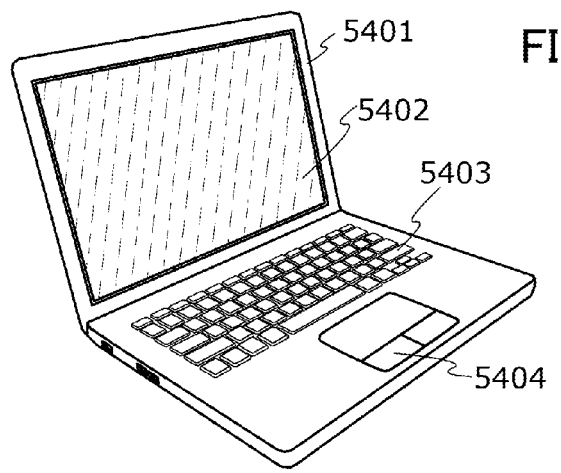

FIG. 16C illustrates a notebook type personal computer which includes a housing 5401, a display portion 5402, a keyboard 5403, a pointing device 5404, and the like. The semiconductor device of one embodiment of the present invention can be used for a variety of integrated circuits included in notebook type personal computers.

Figure 16D:
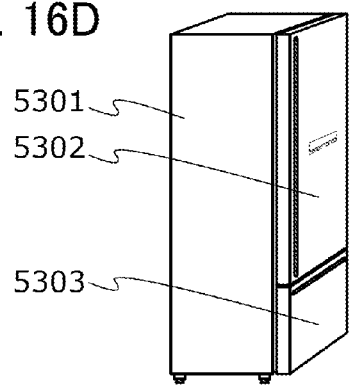

FIG. 16D illustrates an electric refrigerator-freezer including a housing 5301, a refrigerator door 5302, a freezer door 5303, and the like. The semiconductor device of one embodiment of the present invention can be used for a variety of integrated circuits included in electric refrigerator-freezers.

Figure 16E:
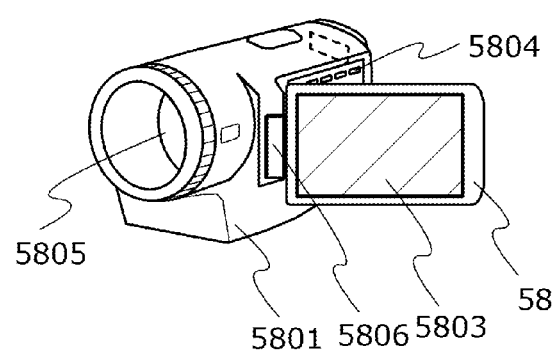

FIG. 16E illustrates a video camera which includes a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 16F:
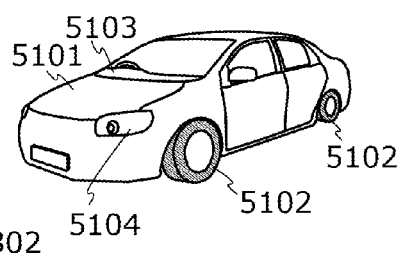

FIG. 16F illustrates a passenger car which includes a car body 5101, wheels 5102, a dashboard 5103, lights 5104, and the like. The semiconductor device of one embodiment of the present invention can be used for a variety of integrated circuits included in passenger cars.

<Others>

For example, in this specification and the like, when it is described that X and Y are connected, the case where X and Y are electrically connected, the case where X and Y are functionally connected, and the case where X and Y are directly connected are included therein. Accordingly, another element may be interposed between elements having a connection relation shown in drawings and texts, without limiting to a predetermined connection relation, for example, the connection relation shown in the drawings and the texts.

Here, X, Y, and the like each denote an object (e.g., a device, an element, a circuit, a line, an electrode, a terminal, a conductive film, a layer, or the like).

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a dc-dc converter, a step-up dc-dc converter, or a step-down dc-dc converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X the source (or the first terminal or the like) of the transistor, the drain (or the second terminal or the like) of the transistor, and Y are electrically connected to each other in this order", "a source (or a first terminal or the like) of a transistor is electrically connected to X a drain (or a second terminal or the like) of the transistor is electrically connected to Y, and X the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

Note that contents that are not specified in any drawing or text in the specification can be excluded from one embodiment of the invention. Alternatively, when the range of a value that is defined by the maximum and minimum values is described, part of the range is appropriately narrowed or part of the range is removed, whereby one embodiment of the invention excluding part of the range can be constituted. In this manner, it is possible to specify the technical scope of one embodiment of the present invention so that a conventional technology is excluded, for example.

As a specific example, a diagram of a circuit including a first transistor to a fifth transistor is illustrated. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, a description of a value, "a voltage is preferably higher than or equal to 3 V and lower than or equal to 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than or equal to 10 V but is not 9 V in the invention. Note that even when the description "a value is preferably in a certain range" or "a value preferably satisfies a certain condition" is given, the value is not limited to the description. In other words, a description of a value that includes a term "preferable", "preferably", or the like does not necessarily limit the value.

As another specific example, a description "a voltage is preferred to be 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, a description "a film is an insulating film" is given to describe properties of a material. In that case, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the insulating film is a conductive film is excluded from one embodiment of the invention. For example, it can be specified that the case where the insulating film is a semiconductor film is excluded from one embodiment of the invention.

As another specific example, the description of a stacked structure, "a film is provided between an A film and a B film" is given. In that case, for example, it can be specified that the case where the film is a stacked film of four or more layers is excluded from the invention. For example, it can be specified that the case where a conductive film is provided between the A film and the film is excluded from the invention.

Note that various people can implement one embodiment of the invention described in this specification and the like. However, different people may be involved in the implementation of the invention. For example, in the case of a transmission/reception system, the following case is possible: Company A manufactures and sells transmitting devices, and Company B manufactures and sells receiving devices. As another example, in the case of a light-emitting device including a transistor and a light-emitting element, the following case is possible: Company A manufactures and sells semiconductor devices including transistors, and Company B purchases the semiconductor devices, provides light-emitting elements for the semiconductor devices, and completes light-emitting devices.

In such a case, one embodiment of the invention can be constituted so that a patent infringement can be claimed against each of Company A and Company B. In other words, one embodiment of the invention can be constituted so that only Company A implements the embodiment, and another embodiment of the invention can be constituted so that only Company B implements the embodiment. One embodiment of the invention with which a patent infringement suit can be filed against Company A or Company B is clear and can be regarded as being disclosed in this specification or the like. For example, in the case of a transmission/reception system, even when this specification or the like does not include a description of the case where a transmitting device is used alone or the case where a receiving device is used alone, one embodiment of the invention can be constituted by only the transmitting device and another embodiment of the invention can be constituted by only the receiving device. Those embodiments of the invention are clear and can be regarded as being disclosed in this specification or the like. Another example is as follows: in the case of a light-emitting device including a transistor and a light-emitting element, even when this specification or the like does not include a description of the case where a semiconductor device including the transistor is used alone or the case where a light-emitting device including the light-emitting element is used alone, one embodiment of the invention can be constituted by only the semiconductor device including the transistor and another embodiment of the invention can be constituted by only the light-emitting device including the light-emitting element. Those embodiments of the invention are clear and can be regarded as being disclosed in this specification or the like.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which the terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the invention can be clear. Furthermore, it can be determined that one embodiment of the invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, in a diagram or a text described in one embodiment, it is possible to take out part of the diagram or the text and constitute an embodiment of the invention. Thus, in the case where a diagram or a text related to a certain portion is described, the context taken out from part of the diagram or the text is also disclosed as one embodiment of the invention, and one embodiment of the invention can be constituted. The embodiment of the invention is clear. Therefore, for example, in a diagram or text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). As another example, it is possible to constitute one embodiment of the invention by taking out M layers (M is an integer, where M<N) from a cross-sectional view in which N layers (N is an integer) are provided. As another example, it is possible to constitute one embodiment of the invention by taking out M elements (M is an integer, where M<N) from a flow chart in which N elements (N is an integer) are provided. As another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in the case where at least one specific example is described in a diagram or a text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the invention is clear.

Note that in this specification and the like, a content described in at least a diagram (which may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted. The embodiment of the invention is clear.

This application is based on Japanese Patent Application serial no. 2014-044469 filed with Japan Patent Office on Mar. 7, 2014, and Japanese Patent Application serial no. 2014-047203 filed with Japan Patent Office on Mar. 11, 2014, the entire contents of which are hereby incorporated by reference.

What is claimed is:

1. A semiconductor device comprising:
a first logic element;
a second logic element; and
a first switch,
wherein the first switch is configured to electrically connect an output terminal of the first logic element to an input terminal of the second logic element,
wherein the semiconductor device is configured to rewrite configuration data to the first switch repeatedly, until the configuration data is written to the first switch while an output of the first logic element is a low-level voltage, and
wherein the semiconductor device further comprises a determination device determining whether the configuration data is written or not while the output of the first logic element is the low-level voltage.

2. The semiconductor device according to claim 1,
wherein the first switch comprises a first transistor and a second transistor,
wherein an electrical current path connecting the output of the first logic element to the input of the second logic element goes through a source and a drain of the first transistor,
wherein one of a source and a drain of the second transistor and a gate of the first transistor form an electrical node, and
wherein the second transistor includes a channel formation region in an oxide semiconductor film.

3. The semiconductor device according to claim 2,
wherein the first transistor includes a channel formation region in a single crystal semiconductor substrate, and
wherein the oxide semiconductor film overlaps the single crystal semiconductor substrate.

4. An electronic device equipped the semiconductor device according to claim 1.

5. A semiconductor device comprising:
a first logic element;
a second logic element; and
a first switch,
wherein the first switch is configured to control conduction and non-conduction between the first logic element and the second logic element,
the first switch comprising:
a second switch; and
a third switch,
wherein the second switch and the third switch are each configured to electrically connect an output terminal of the first logic element to an input terminal of the second logic element,
wherein when the second switch is on, electrical conduction between the first logic element and the second logic element is established,
wherein when the third switch is on, electrical conduction between the first logic element and the second logic element is established,
wherein the semiconductor device is configured to rewrite configuration data to the second switch and to the third switch repeatedly, until the configuration data is written to the second switch and to the third switch while an output of the first logic element is a low-level voltage, and
wherein the semiconductor device further comprises a determination device determining whether the configuration data is written or not while the output of the first logic element is the low-level voltage.

6. the semiconductor device according to claim 5,
wherein the second switch comprises a first transistor and a second transistor,
wherein an electrical current path connecting the output of the first logic element to the input of the second logic element goes through a source and a drain of the first transistor,
wherein one of a source and a drain of the second transistor and a gate of the first transistor form an electrical node, and
wherein a channel formation region of the second transistor is in an oxide semiconductor layer.

7. The semiconductor device according to claim 6,
wherein the first transistor includes a channel formation region in a single crystal semiconductor substrate, and
wherein the oxide semiconductor film overlaps the single crystal semiconductor substrate.

8. The semiconductor device according to claim 6,
wherein the second switch and the third switch have a similar structure, and
wherein the other of the source and the drain of second transistor of the second switch and the other of the source and the drain of second transistor of the third switch are directly connected to a same wiring.

9. An electronic device equipped the semiconductor device according to claim 5.

10. A semiconductor device comprising:
a first logic element;
a second logic element; and
a first switch,
wherein the first switch is configured to electrically connect an output terminal of the first logic element to an input terminal of the second logic element, and wherein the semiconductor device is configured to write configuration data to the first switch while an output of the first logic element is a low-level voltage, and
wherein the semiconductor device further comprises a determination device determining whether the configuration data is written or not while the output of the first logic element is the low-level voltage.

11. The semiconductor device according to claim 10,
wherein the first switch comprises a first transistor and a second transistor,
wherein an electrical current path connecting the output of the first logic element to the input of the second logic element goes through a source and a drain of the first transistor,
wherein one of a source and a drain of the second transistor and a gate of the first transistor form an electrical node, and
wherein a channel formation region of the second transistor is in an oxide semiconductor layer.

12. The semiconductor device according to claim 11,
wherein the first transistor includes a channel formation region in a single crystal semiconductor substrate, and
wherein the oxide semiconductor film overlaps the single crystal semiconductor substrate.

13. An electronic device equipped the semiconductor device according to claim 10.

14. A semiconductor device comprising:
a first logic element;
a second logic element; and
a first switch,
wherein the first switch is configured to electrically connect an output terminal of the first logic element to an input terminal of the second logic element, and
wherein the semiconductor device is configured to rewrite configuration data to the first switch repeatedly, until the configuration data is written to the first switch while an output of the first logic element is a low-level voltage
wherein the first switch comprises a first transistor and a second transistor,
wherein an electrical current path connecting the output of the first logic element to the input of the second logic element goes through a source and a drain of the first transistor,
wherein one of a source and a drain of the second transistor and a gate of the first transistor form an electrical node,
wherein the second transistor includes a channel formation region in an oxide semiconductor film, and
wherein the first switch further comprises a third transistor connected in series between the first transistor and the input of the second logic element.

15. The semiconductor device according to claim 14, further comprising a determination device determining whether the configuration data is written or not while the output of the first logic element is the low-level voltage.

16. A semiconductor device comprising:
a first logic element;
a second logic element; and
a first switch,
wherein the first switch is configured to control conduction and non-conduction between the first logic element and the second logic element,
the first switch comprising:
a second switch; and
a third switch,
wherein the second switch and the third switch are each configured to electrically connect an output terminal of the first logic element to an input terminal of the second logic element,
wherein when the second switch is on, electrical conduction between the first logic element and the second logic element is established,
wherein when the third switch is on, electrical conduction between the first logic element and the second logic element is established,
wherein the semiconductor device is configured to rewrite configuration data to the second switch and to the third switch repeatedly, until the configuration data is written to the second switch and to the third switch while an output of the first logic element is a low-level voltage,
wherein the second switch comprises a first transistor and a second transistor,
wherein an electrical current path connecting the output of the first logic element to the input of the second logic element goes through a source and a drain of the first transistor,
wherein one of a source and a drain of the second transistor and a gate of the first transistor form an electrical node,
wherein a channel formation region of the second transistor is in an oxide semiconductor layer, and
wherein the second switch further comprises a third transistor connected in series between the first transistor and the input of the second logic element.

17. The semiconductor device according to claim 16, further comprising a determination device determining whether the configuration data is written or not while the output of the first logic element is the low-level voltage.

18. A semiconductor device comprising:
a first logic element;
a second logic element; and
a first switch,
wherein the first switch is configured to electrically connect an output terminal of the first logic element to an input terminal of the second logic element, and wherein the semiconductor device is configured to write configuration data to the first switch while an output of the first logic element is a low-level voltage,
wherein the first switch comprises a first transistor and a second transistor,
wherein an electrical current path connecting the output of the first logic element to the input of the second logic element goes through a source and a drain of the first transistor,
wherein one of a source and a drain of the second transistor and a gate of the first transistor form an electrical node,
wherein a channel formation region of the second transistor is in an oxide semiconductor layer, and
wherein the first switch further comprises a third transistor connected in series between the first transistor and the input of the second logic element.

19. The semiconductor device according to claim 18, further comprising a determination device determining whether the configuration data is written or not while the output of the first logic element is the low-level voltage.

* * * * *